United States Patent [19]
Matsumoto

[11] Patent Number: 5,657,330
[45] Date of Patent: Aug. 12, 1997

[54] SINGLE-CHIP MICROPROCESSOR WITH BUILT-IN SELF-TESTING FUNCTION

[75] Inventor: Hiroyuki Matsumoto, Itami, Japan

[73] Assignees: Mitsubishi Denki Kabushiki Kaisha, Tokyo; Mitsubishi Electric Semiconductor Software Co., Ltd., Hyogo, both of Japan

[21] Appl. No.: 491,557

[22] Filed: Jun. 15, 1995

[30] Foreign Application Priority Data

Nov. 15, 1994 [JP] Japan .................................. 6-280545

[51] Int. Cl.[6] .................................................. G06F 11/00
[52] U.S. Cl. ........................................................ 371/22.5
[58] Field of Search .............................. 371/22.5, 22.1, 371/22.6, 27; 324/210; 395/183.01, 183.06

[56] References Cited

U.S. PATENT DOCUMENTS

| | | | |
|---|---|---|---|
| 4,433,413 | 2/1984 | Fasang | 371/25 |
| 5,119,378 | 6/1992 | Welles, II et al. | 371/22.5 |
| 5,157,781 | 10/1992 | Harwood et al. | 395/575 |

*Primary Examiner*—Vincent P. Canney
*Attorney, Agent, or Firm*—Lowe, Price, LeBlanc & Becker

[57] ABSTRACT

A single-chip microprocessor with a self-testing function for quickly detecting internal errors or defects while mounted to a circuit board without adversely affecting any external electronic devices connected thereto.

A single-chip microprocessor comprising a built-in self-testing function for testing the internal circuitry thereof comprises a test mode signal output means for outputting the test mode signal when in the test mode, which is a mode for self-diagnostic testing of the internal circuitry; and an external output holding means disposed to the external output means for outputting signals from an external output terminal, and holding the output signal status of the external output terminal while the test mode signal is input from the test mode signal output means; and testing the internal circuitry of the single-chip microprocessor while holding the output signal status of the external output terminal.

8 Claims, 14 Drawing Sheets

SINGLE-CHIP MICROPROCESSOR WITH BUILT-IN SELF-TESTING FUNCTION

BACKGROUND OF THE INVENTION

1. Field of the Invention

The present invention relates to a single-chip microprocessor comprising a built-in self-testing function whereby said single-chip microprocessor tests whether the built-in internal circuits of the single-chip microprocessor are normal or defective.

2. Description of the Prior Art

In a conventional single-chip microprocessor with a built-in self-testing function, the test for determining whether the processor is functioning normally or not can only be used for testing the single-chip microprocessor using a tester before mounting the single-chip microprocessor to the circuit board, even though the self-testing function is built in to the microprocessor. Once the single-chip microprocessor is mounted, abnormal operation must first be detected in the system of the board to which the microprocessor is mounted in order to confirm errors or defective operation in the microprocessor.

FIG. 19 is a block diagram of the external output circuit of a conventional single-chip microprocessor. As shown in FIG. 19, the output signal from the function module 110 passes through invertor 111 directly into the external output buffer comprising p-channel MOS-FET 24 and n-channel MOS-FET 25 from which the signal is output through the external output terminal.

In a conventional single-chip microprocessor thus comprised, however, if the external output signal of the single-chip microprocessor is tested using the idle time of an operating single-chip microprocessor mounted to a circuit board, i.e., using the time in which the board-mounted single-chip microprocessor does not need to interface with other external devices during microprocessor operation, a signal change is applied to the external electronic device(s) connected to the external output terminal. As a result, self-testing cannot be executed even during the idle time of the single-chip microprocessor; determining the interrelationship between various signals with an added time factor, and similarly precise testing of board-mounted single-chip microprocessors is not possible; detecting the breakdown of or defects in single-chip microprocessors after board mounting is difficult; and it is therefore difficult and time-consuming to precisely determine both the location and the cause of errors or defects in a single-chip microprocessor.

SUMMARY OF THE INVENTION

Therefore, an object of the present invention is to provide a single-chip microprocessor capable of executing a self-testing operation while mounted on a circuit board without adversely affecting any external electronic components connected thereto, and which can therefore quickly detect internal damage and defects after being mounted to a circuit board.

To achieve this object, a single-chip microprocessor with built-in self-testing function according to the present invention comprises a test mode signal output means for outputting a test mode signal, and an external output holding means for holding the output signal status of the external output terminal during the test mode.

A single-chip microprocessor with a built-in self-testing function for testing the internal circuitry. thereof according to the second embodiment of the invention comprises a test mode signal output means for outputting the test mode signal, and an external terminal interrupting means for interrupting the input and output of signals from the external terminal during the test mode.

A single-chip microprocessor with a built-in self-testing function for testing the internal circuitry thereof according to the third embodiment of the invention is a single-chip microprocessor according to Claim 1 further comprising an external terminal interrupting means for interrupting the input and output of signals from the external terminal during the test mode.

A single-chip microprocessor with a built-in self-testing function for testing the internal circuitry thereof according to the fourth embodiment of the invention is a single-chip microprocessor according to Claim 2 or Claim 3 further comprising a connecting means for interconnecting the input terminals and output terminals of different internal circuits forming plural function modules based on the test mode signal from the test mode signal output means.

A single-chip microprocessor with a built-in self-testing function for testing the internal circuitry thereof according to the fifth embodiment of the invention is a single-chip microprocessor according to any of Claims 1 to 4 wherein the test mode signal output means comprises a register, and is characterized by setting said register to a first state and outputting the test mode signal based on a start signal received at the start of the test mode, and setting said register to a second State and canceling the test mode signal based on a cancellation signal received when the test mode ends.

A single-chip microprocessor with a built-in self-testing function for testing the internal circuitry thereof according to the sixth embodiment of the invention is a single-chip microprocessor according to Claim 5 wherein the test mode signal output means is characterized by the test mode start and end signals input thereto being input from the central processing unit.(CPU).

A single-chip microprocessor with a built-in self-testing function for testing the internal circuitry thereof according to the seventh embodiment of the invention is a single-chip microprocessor according to Claim 5 wherein the test mode signal output means is characterized by the test mode start and end signals input thereto being input from an external terminal.

A single-chip microprocessor with a built-in self-testing function for testing the internal circuitry thereof according to the eighth embodiment of the invention is a single-chip microprocessor according to any of Claims 1 to 4 wherein the test mode signal output means outputs the test mode signal during normal operating mode idle time when interfacing with external devices is not necessary.

A single-chip microprocessor with a built-in self-testing function for testing the internal circuitry thereof according to the ninth embodiment of the invention is a single-chip microprocessor according to any of Claims 1 to 4 further comprising a storage means for storing the test mode program, and a signal generating means for generating signals according to the program stored by the storage means.

A single-chip microprocessor with a built-in self-testing function for testing the internal circuitry thereof according to the tenth embodiment of the invention is a single-chip microprocessor according to any of Claims 1 to 4 further comprising a storage means for storing the test mode program, and a testing means for testing the internal circuit targeted by the test according to the program stored by the storage means.

A single-chip microprocessor with a built-in self-testing function for testing the internal circuitry thereof according to the eleventh embodiment of the invention is a single-chip microprocessor according to Claim 9 wherein the signal generating means generates a testing input signal input to the internal circuit forming the input module to be tested.

A single-chip microprocessor with a built-in self-testing function for testing the internal circuitry thereof according to the twelfth embodiment of the invention is a single-chip microprocessor according to Claim 10 wherein the testing means determines whether the output module being tested is normal or defective by comparing the output signal from the internal circuit forming said output module with an expected value stored in the storage means.

A single-chip microprocessor with a built-in self-testing function for testing the internal circuitry thereof according to the thirteenth embodiment of the invention is a single-chip microprocessor according to any of Claims 1 to 4 wherein the central processing unit is characterized by causing the output signal from the internal circuit being tested to be input to the central processing unit through the data bus during the test mode, and determining based on said signal input whether the internal circuit being tested is normal or defective.

A single-chip microprocessor with a built-in self-testing function for testing the internal circuitry thereof according to the fourteenth embodiment of the invention is a single-chip microprocessor according to Claim 4 wherein the connecting means is characterized by connecting the output of an internal output timer with the input of an internal input timer based on the test mode signal from the test mode signal output means, and testing by detecting the signals input and output between said timers.

A single-chip microprocessor with a built-in self-testing function for testing the internal circuitry thereof according to the fifteenth embodiment of the invention is a single-chip microprocessor according to Claim 4 wherein the connecting means is characterized by connecting the output of a serial input/output unit with the input of another serial input/output unit, and testing by detecting the signals input and output between said serial input/output units.

[Operation]

In a single-chip microprocessor according to Claim 1, the external output holding means holds the output signal status of the external output terminal based on the test mode signal input from the test mode signal output means during the test mode.

In a single-chip microprocessor according to Claim 2, the external terminal interrupting means interrupts the input and output of signals from the external terminal based on the test mode signal input from the test mode signal output means during the test mode.

In a single-chip microprocessor according to Claim 3, the external terminal interrupting means interrupts the input and output of signals from the external terminal based on the test mode signal input from the test mode signal output means during the test mode.

In a single-chip microprocessor according to Claim 4, the input terminals of the internal circuits forming the function modules for which input/output of signals is interrupted at the external terminals during the test mode are connected with the output terminals of the internal circuits forming the other function modules for testing each of said internal circuits.

In a single-chip microprocessor according to Claim 5, the test mode signal output means of Claims 1 to 4 sets the register to a first state and outputs the test mode signal based on a start signal received at the start of the test mode, and sets the register to a second state and cancels the test mode signal based on a cancellation signal received when the test mode ends.

In a single-chip microprocessor according to Claim 6, the test mode start and end signals are input to the test mode signal output means from the central processing unit.

In a single-chip microprocessor according to Claim 7, the test mode start and end signals are input to the test mode signal output means from the external terminal.

In a single-chip microprocessor according to Claim 8, the test mode signal output means of Claims 1 to 4 outputs the test mode signal during normal operating mode idle time when interfacing with external devices is not necessary.

In a single-chip microprocessor according to Claim 9, the test signals generated by the signal generating means according to the test mode program stored in the storage means are input to the internal circuits forming the respective function modules, and the internal circuits are tested by evaluating the signals output from each of the internal circuits in response to the test signals input thereto.

In a single-chip microprocessor according to Claim 10, the internal circuits are tested by evaluating the signals output from each of the internal circuits according to the test mode program stored in the storage means.

In a single-chip microprocessor according to Claim 11, the signal generating means of Claim 9 generates the test signal input to the internal circuit forming the input module to be tested.

In a single-chip microprocessor according to Claim 12, the testing means of Claim 10 determines whether the output module being tested is normal or defective by comparing the output signal from the internal circuit forming said output module with the expected value stored in the storage means.

In a single-chip microprocessor according to Claim 13, the central processing unit of any of Claims 1 through 4 causes the output signal from the internal circuit being tested to be input to the central processing unit through the data bus during the test mode, and determines based on said signal input to the central processing unit whether the internal circuit being tested is normal or defective.

In a single-chip microprocessor according to Claim 14, the connecting means of Claim 4 connects the output of an internal output timer with the input of an internal input timer based on the test mode signal from the test mode signal output means, and tests for normal operation by detecting the signals input and output between said timers.

In a single-chip microprocessor according to Claim 15, the connecting means of Claim 4 connects the output of one serial input/output unit with the input of another serial input/output unit based on the test mode signal from the test mode signal output means, and tests for normal operation by detecting the signals input and output between said serial input/output units.

BRIEF DESCRIPTION OF THE DRAWINGS

The present invention will become more fully understood from the detailed description given below and the accompanying diagrams wherein.

DESCRIPTION OF PREFERRED EMBODIMENTS

The preferred embodiments of a single-chip microprocessor with built-in self-testing function according to the invention are described below with reference to the accompanying figures.

(Embodiment 1)

Figure 1:
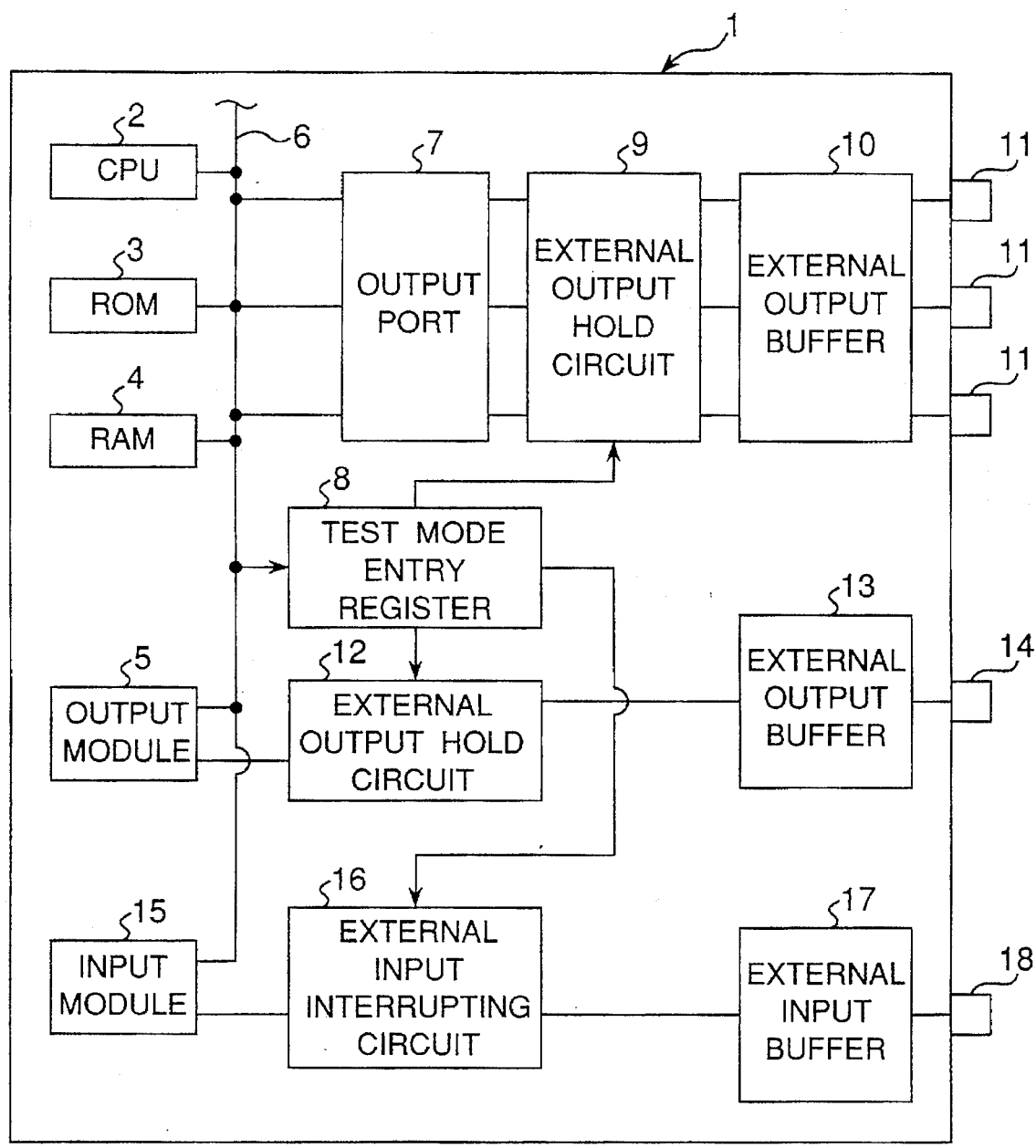
FIG. 1 is a block diagram of a single-chip microprocessor with built-in self-testing function according to the first embodiment of the invention.

FIG. 1 is a block diagram of a single-chip microprocessor with built-in self-testing function according to the first embodiment of the invention as described below.

Referring to FIG. 1, the single-chip microprocessor 1 of this embodiment comprises a central processing unit (CPU) 2 for controlling operation in both the normal operating mode and the test mode in which the self-diagnostic test is executed; a ROM 3 for storing the operating programs applied in the normal and test modes; and a RAM 4. The RAM 4 is used as system memory during the normal operating mode, and is used to store and save the register values of the CPU 2 and the target test module when the test mode is selected from the normal operating mode, and to restore the register values of the CPU 2 and target test module when the normal operating mode is resumed from the test mode.

The single-chip microprocessor 1 further comprises an output module 5 including an output timer; a data bus 6; output port 7; a test mode entry register 8, which is the register for setting the normal operating mode or the test mode, and which functions as the test mode signal output means of the Claims; an external output hold circuit 9 functioning as the external output holding means of the Claims for holding the status of the output signal output to an external device through the output port 7 during the test mode based on the current status of the test mode entry register 8; and an external output buffer 10 for outputting the output signals of the external output hold circuit 9 to an external device through the external output terminals 11.

It is to be noted that the external output hold circuit 9 and external output buffer 10 combine to function as the external output means of the Claims, and the output port 7, external output hold circuit 9, and external output buffer 10 are discretely disposed in a number equal to the number of external output terminals 11.

The single-chip microprocessor 1 of this embodiment further comprises an external output hold circuit 12 for holding the status of the output signal from the output module 5 during the test mode based on the current status of the test mode entry register 8; an external output buffer 13 for outputting the output signals of the external output hold circuit 12 to an external device through the external output terminal 14; an input module 15 including an input timer; and an external input interrupting circuit 16 functioning as the external terminal interrupting means of the Claims for interrupting the external input signal so that the external input signal is not input to the input module 15 through the external input buffer 17 from the external input terminal 18 during the test mode based on the current status of the test mode entry register 8.

The CPU 2, ROM 3, RAM 4, output module 5, output port 7, test mode entry register 8, and input module 15 are commonly connected to the data bus 6. The output port 7 is connected to the external output hold circuit 9, which is further connected to the external output terminals 11 through the external output buffer 10. The output module 5 is further connected to the external output hold circuit 12, which is connected to the external output terminal 14 through the external output buffer 13. The test mode entry register 8 is connected to the external output hold circuits 9 and 12, and to the external input interrupting circuit 16. The input module 15 is connected to the external input interrupting circuit 16, which is further connected to the external input terminal 18 through the external input buffer 17.

In a single-chip microprocessor 1 thus comprised, the CPU 2 resets the test mode entry register 8 during the normal operating mode. As a result, the output signal hold function of the external output hold circuits 9 and 12, and the input signal interrupt function of the external input interrupting circuit 16, do not operate; the output signals from the output module 5 and output port 7 are output through the corresponding external output hold circuits 9 and external output buffers 10 from the external output terminals 11 and 14; and the external input signal from the external input terminal 18 is input through the external input buffer 17 and external input interrupting circuit 16 to the input module 15.

The CPU 2 switches from the normal operating mode to the test mode by setting the test mode entry register 8 according to a predetermined control program stored in the ROM 3. For example, to enter the test mode, the CPU 2 may set the test mode entry register 8 during normal operating mode idle time when interfacing with external devices is not required, and then execute the test mode program also stored to the ROM 3 to control operation in the test mode.

When the operating mode is changed from the normal operating mode to the test mode, the CPU 2 stores and saves the register values for the CPU 2 and the module to be self-tested to the RAM 4. By setting the test mode entry register 8, the external output hold circuits 9 and 12 hold the status of the output signals from the output port 7 and output module 5, respectively, and the held output signals are output from the corresponding external output terminals 11 and 14 through the external output buffers 10 and 13. The external input interrupting circuit 16 also interrupts the signal input through the external input buffer 17 from the external input terminal 18 to prevent the signal from being input to the input module 15.

When the self-diagnostic test is completed and the test mode entry register 8 is reset, thus switching from test mode to normal operating mode operation, the CPU 2 restores the register values for the CPU 2 and the module to be self-tested saved to the RAM 4 to the respective registers; and external output hold circuits 9 and 12 cancel the held status of the output signals from the output port 7 and output module 5, and output the output signals from the output port 7 and output module 5 through the external output buffers 10 and 13 directly from the external output terminals 11 and 14. The external input interrupting circuit 16 also cancels interruption of the external input signal input through the external input buffer 17 from the external input terminal 18, thereby enabling the external input signal to be input to the input module 15.

Figure 2:
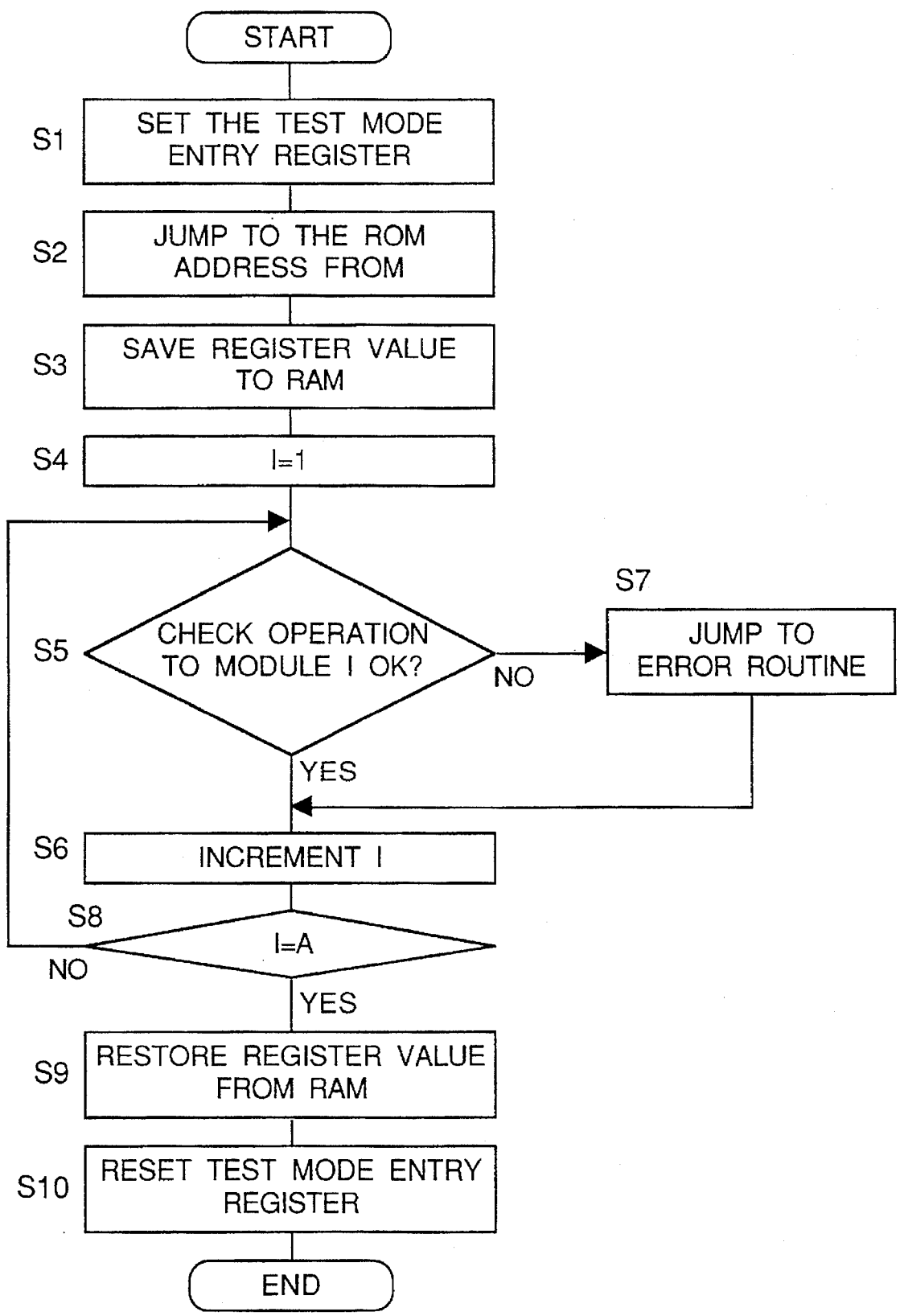
FIG. 2 is a flow chart of the test mode operation of a single-chip microprocessor according to the first embodiment of the invention.

The test mode operation of a single-chip microprocessor 1 as shown in FIG. 1 is described below with reference to the flow chart shown in FIG. 2.

To execute test mode operation, the CPU 2 first sets the test mode entry register 8 in step S1, jumps to the ROM address from which the test mode program is stored in the ROM 3 (step S2), and then executes the test mode program from step S3.

In step S3, the CPU 2 saves the register values of the CPU 2 and target test module to the RAM, 4, and then initializes the index counter i to 1 in step S4. The index counter i is used to count the index numbers assigned to each target test module as a means of determining whether each of the target test modules has been tested.

In step S5, the CPU 2 checks the operation of target test module i corresponding to the current value of the index counter i. In this example, the value of the index counter i is 1, and target test module 1 is therefore tested. If the test module operates normally (step S5 returns YES), the index counter i is incremented in step S6. If an error occurs while testing the operation of the target module, and step S5 therefore returns NO, the procedure branches to the error handling routine of step S7. After executing the error handling routine, the procedure returns to the main loop, and the index counter i is incremented in step S6.

It is to be noted that any of various known error handling routines may be executed in step S7, and further description thereof is therefore omitted below.

In step S8, the CPU 2 determines whether the current value of the index counter i is equal to a predetermined value A, which is a value corresponding to the last module to be tested and therefore indicates that all test modules have been tested when i=A. If i=A (step S8 returns YES), the CPU 2 and target test module register values are read from the RAM 4, and restored to the respective registers. The test mode entry register 8 is then reset in step S10, and the procedure terminates.

If in step S8 i<A and NO is therefore returned, the procedure loops back to step S5 to test the next module. This loop from step S5 to step S8 repeats until all modules have been tested.

Figure 3:
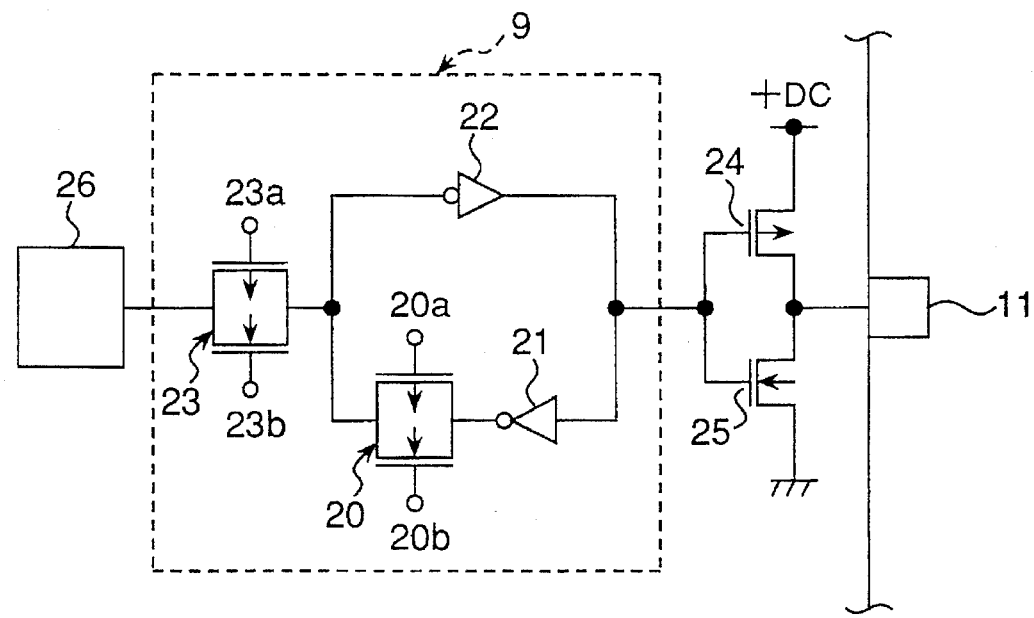
FIG. 3 is a schematic diagram of the external output hold circuits and the external output buffers shown in FIG. 1.

The specific circuit configurations of the function blocks shown in the block diagram of FIG. 1 are described below. FIG. 3 is a schematic diagram of the external output hold circuits 9 and 12 and the external output buffers 10 and 13 shown in FIG. 1. These are described below with reference to the external output hold circuit 9 and external output buffer 10.

In FIG. 3, the output of the invertor 21 is connected to the input of the transfer gate 20, forming a series circuit, and the output of the second invertor 22 is connected in series thereto: the output of the second invertor 22 is connected to the input of the first invertor 21, and the input of the second invertor 22 is connected to the output of the transfer gate 20. The output of another transfer gate 23 is also connected to the connection between the first transfer gate 20 and the second invertor 22.

The level-inverted signal output from the test mode entry register 8 is input to the one control signal input 20a of the one transfer gate 20 and to the one control signal input 23b of the other transfer gate 23; the output signal from the test mode entry register 8 is input directly to the other control signal input 20b of the one transfer gate 20 and to the other control signal input 23a of the other transfer gate 23.

Note that the input of the transfer gate 23 functions as the input of the external output hold circuit 9, and is connected to the output port 7. The connection between the input of the one invertor 21 and the output of the other invertor 22 also functions as the output of the external output hold circuit 9, and is connected to the input of the external output buffer 10.

The external output buffer 10 comprises p-channel MOS-FET 24 and n-channel MOS-FET 25. The gate of the p-channel MOS-FET 24 is connected to the gate of the n-channel MOS-FET 25, and the source of the p-channel MOS-FET 24 is connected to the drain of the n-channel MOS-FET 25. The drain of the p-channel MOS-FET 24 is connected to the positive DC terminal of the DC power supply, and the source of the n-channel MOS-FET 25 is grounded.

The gate-gate connection between the p-channel MOS-FET 24 and n-channel MOS-FET 25 functions as the input to the external output buffer 10. The source-drain connection between the p-channel MOS-FET 24 and n-channel MOS-FET 25 functions as the output from the external output buffer 10, and is connected to the external output terminals 11.

With this configuration, the test mode entry register 8 is reset during the normal operating mode, a LOW signal is input to the control signal inputs 23a and 20b of the transfer gates 23 and 20, respectively, a HIGH signal is input to control signal inputs 23b and 20a, respectively, and the transfer gates 20 and 23 become respectively OFF and ON. As a result, the signal from the output port 7 passes the first transfer gate 23, the invertor 22, and is input to the external output buffer 10, and the external output buffer 10 outputs to the external output terminals 11.

During the test mode, however, the test mode entry register 8 is set. As a result, a HIGH signal is input to control signal inputs 23a and 20b, and a LOW signal is input to control signal inputs 23b and 20a, of the transfer gates 23 and 20, respectively. As a result, the transfer gate 23 becomes OFF and the signal from the output port 7 is interrupted, and the transfer gate 20 becomes ON, thus forming a latch circuit by means of transfer gate 20, invertor 21, and invertor 22. As a result, the status of the signal from the output port 7 immediately prior to the transfer gate 23 becoming OFF is held by the latch circuit, and the signal status from the external output buffer 10 immediately before the test mode is entered is also stored and output from the external output terminals 11.

Figure 4:
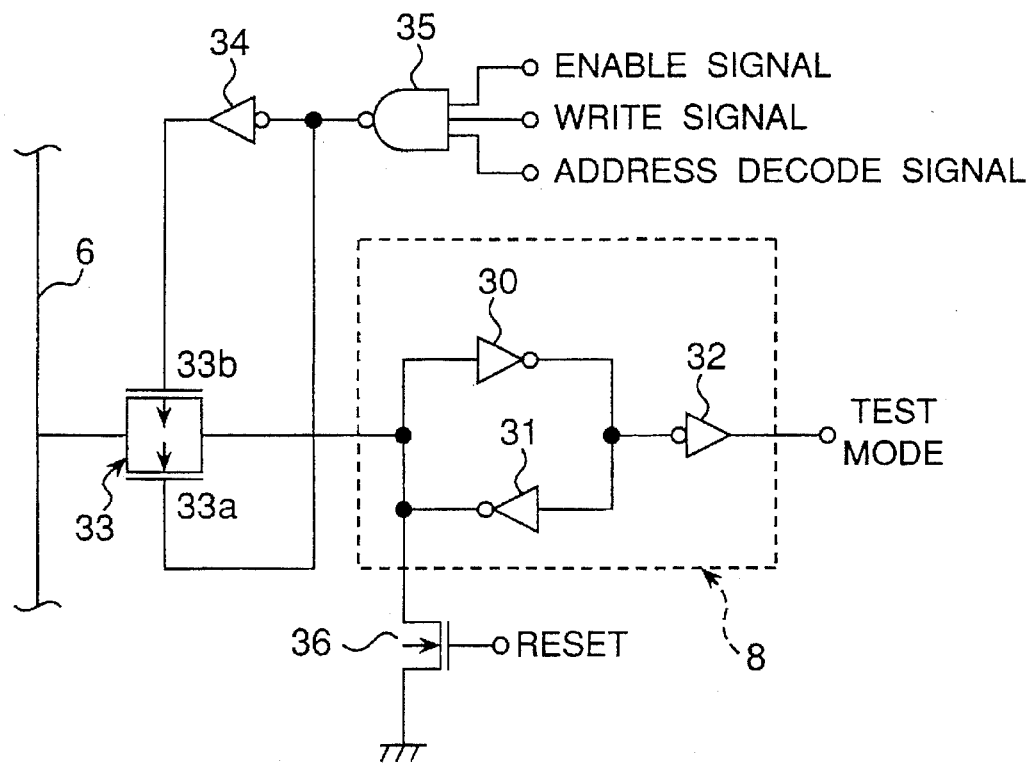
FIG. 4 is a schematic diagram of the test mode entry register shown in FIG. 1.

FIG. 4 is a similar schematic diagram of the test mode entry register 8 shown in FIG. 1.

As shown in FIG. 4, the test mode entry register 8 comprises a latch circuit formed by serially connecting two invertors 30 and 31 in a loop, and a third invertor 32 of which the input is connected to the connection between the output of the one invertor 30 and the input of the other invertor 31 in the latch circuit. The output of this third invertor 32 forms the TEST MODE terminal from which the test mode signal is output. The test mode signal indicates whether the operating mode is the normal operating mode or the test mode; in this embodiment, the test mode entry register 8 is set (the test mode signal is set) during the test mode.

The connection between the input of the one invertor 30 and the output of the other invertor 31 is connected to the output of the transfer gate 33, the input of which is connected to the data bus 6. The one control signal input 33a of the transfer gate 33 is connected to the input of another invertor 34, and the other control signal input 33b of the transfer gate 33 is connected to the output of the same invertor 34. Also connected to the input of this invertor 34 is the output of a three input NAND 35.

The three inputs to the NAND 35 are an ENABLE signal, WRITE signal, and DECODE signal. When the three inputs (ENABLE, WRITE, and DECODE signals) are HIGH, the output of the NAND 35 is LOW, the one control signal input 33a of the transfer gate 33 is LOW, and the other control signal input 33b of the transfer gate 33 is HIGH. The transfer gate 33 is therefore open, and the signal from the data bus 6 is output through the two invertors 30 and 32 and from the TEST MODE terminal of the test mode entry register 8 as the set signal of the test mode entry register 8 output to the control signal inputs of the transfer gates 20 and 23 shown in FIG. 3.

It should be noted that even when the transfer gate 33 closes, the signal status input to the test mode entry register 8 is held by the latch circuit comprising the invertors 30 and 31, and the output signal status of the test mode entry register 8 is therefore also held. A HIGH signal from the data bus 6 is written to the test mode entry register 8 to set the test mode entry register 8 to the test mode, and a LOW signal is similarly written to reset the test mode entry register 8 to the normal operating mode.

The drain of the n-channel MOS-FET 36 is connected to the line connecting the input of the one invertor 30 to the output of the other invertor 31 in the latch circuit; the source of this n-channel MOS-FET 36 is grounded; and the gate of the n-channel MOS-FET 36 can be set HIGH and applied as the reset signal resetting the test mode entry register 8.

Figure 5:
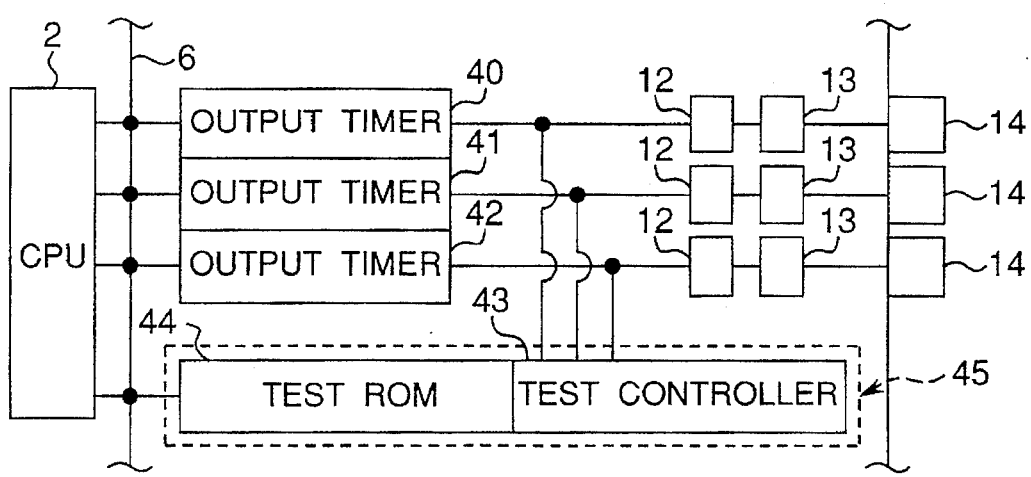
FIG. 5 is a block diagram of one means of testing the output timers in a single-chip microprocessor according to the first embodiment of the invention.

The test mode operation of a single-chip microprocessor 1 according to the first embodiment above is described below using an output timer as the output module. FIG. 5 is a block diagram of one means of testing the output timers in this single-chip microprocessor 1.

Referring to FIG. 5, the output timers 40, 41, and 42 are connected to the CPU 2 by means of the data bus 6, and are connected to the external output terminals 14 through the corresponding external output hold circuits 12 and external output buffers 13. The connections between the output timers 40, 41, and 42 and the external output hold circuits 12 are also connected to test controller 43, which functions as the testing means for testing the output timers.

Said test controller 43 is connected to a test ROM 44 for storing the test pattern data, and said test ROM 44 is further connected through the data bus 6 to the CPU 2.

The output timer testing circuit 45 is thus formed by the test controller 43 and the test ROE 42. Note that this test ROM 44 is separate from the system ROM 3.

When the test mode entry register 8 is set in the test mode, the external output hold circuits 12 hold the output signals from the corresponding output timers 40–42, and output through the external output buffers 13 to the external output terminals 14. The CPU 2 outputs the test signal to each of the output timers 40–42 according to the test pattern data stored to the test ROM 44. The signals output by the output timers 40–42 in response to the test signals input thereto are each input to the test controller 43, which compares the input signals with the output data from the test ROM 44 to determine whether that output timer is operating normally.

The operation of the test controller 43 shown in FIG. 5 is described below with reference to the schematic diagram thereof shown in FIG. 6.

Figure 6:
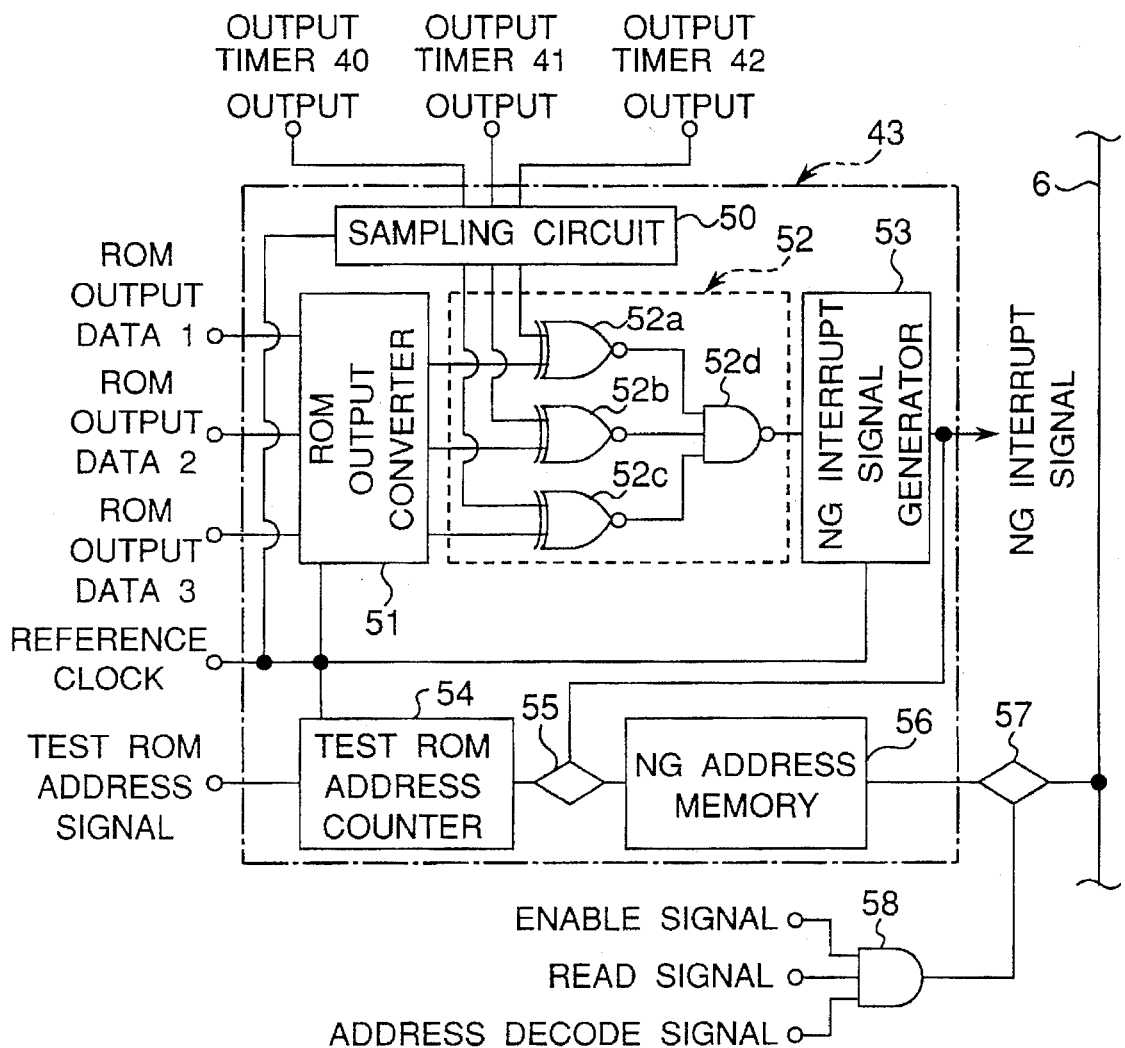
FIG. 6 is a block diagram of the test control circuit shown in FIG. 5.

The test controller 43 is indicated by the dot-dash line in FIG. 6, and comprises: a sampling circuit 50 for sampling the output signals from the output timers 40–42; a ROM output converter 51 for sampling and outputting the output data from the test ROM 44; a comparator 52 for comparing the signal samples obtained by the sampling circuit 50 and the ROM output converter 51; an NG interrupt signal generator 53 for outputting an interrupt signal to the CPU 2 when an error is detected based on the comparison result output by the comparator 52; a test ROM address counter 54 for incrementing the test ROM address; a transfer gate 55; and an NG address memory 56 for storing the value of the test ROM address counter when an error is detected.

The comparator 52 comprises three exclusive NOR circuits 52a, 52b, and 52c; and a NAND circuit 52d. One input of each of the exclusive NOR circuits 52a, 52b, and 52c is connected to the sampling circuit 50 in a manner whereby this input of exclusive NOR circuit 52a is connected through sampling circuit 50 to the output of output timer 40; this input of exclusive NOR circuit 52b is connected to the output of output timer 41; and this input of exclusive NOR circuit 52c is connected to the output of output timer 42.

<<THE FIGURE SHOWS: through the sampling circuit 50 in a manner whereby this input of exclusive NOR circuit 52a is connected to the output of output timer 42; this input of exclusive NOR circuit 52b is connected to the output of output timer 41; and this input of exclusive NOR circuit 52c is connected to the output of output timer 40. —THE OPPOSITE OF THE TEXT DESCRIPTION>>

The other input of the three exclusive NOR circuits 52a, 52b, and 52c is connected to the ROM output converter 51 in a manner whereby the output data from the test ROM 44 corresponding to output timer 40 is input to exclusive NOR circuit 52a; the output data from the test ROM 44 corresponding to output timer 41 is input to exclusive NOR circuit 52b; and the output data from the test ROM 44 corresponding to output timer 42 is input to exclusive NOR circuit 52c.

The output of exclusive NOR circuit 52a is connected to one input of the three-input NAND circuit 52d, the output of exclusive NOR circuit 52b is connected to one other input of the three-input NAND circuit 52d, and the output of exclusive NOR circuit 52c is connected to the third input of the three-input NAND circuit 52d. The output of the three-input NAND circuit 52d is connected to the NG interrupt signal generator 53.

The output of the NG interrupt signal generator 53 is connected to the control signal input of the transfer gate 55, and to the interrupt control circuit (not shown in the figures) for applying an interrupt signal to the CPU 2.

The test ROM address counter 54 is connected through the transfer gate 55 to the NG address memory 56, which is connected through another transfer gate 57 to the data bus 6, and test ROM address counter 54 is connected to the test ROM 44. It is to be noted that a reference clock is input to the sampling circuit 50, ROM output converter 51, NG interrupt signal generator 53, and test ROM address counter 54 to synchronize operation. The control signal input of the transfer gate 57 is connected to the output of the three-input AND circuit 58, the inputs to which are the ENABLE, READ, and address decode signals.

With a test circuit thus comprised, the values expected (set values) for the output signals from the output timers 40–42 during the test mode are stored to the test ROM 44. During the test mode, the CPU 2 outputs predetermined test signals to the output timers 40–42 according to the test program stored in the test ROM 44; samples the signals output from the output timers 40–42 in response to these test signals using the sampling circuit 50; and inputs the output timer output signals to the one input of the corresponding exclusive NOR circuits 52a–52c.

The ROM output converter 51 samples the test ROM 44 for the ROM output data 1 that is the value expected for the output signal from the output timer 40, and outputs this ROE output data 1 to the other input of the exclusive NOR circuit 52a. If this input signal is the same level as the input signal from the sampling circuit 50, the output of the exclusive NOR circuit 52a will the HIGH; if the levels are different, the output of the exclusive NOR circuit 52a will the LOW.

Similarly for the next exclusive NOR circuit 52b, the ROM output converter 51 samples the test ROM 44 for the ROM output data 2 that is the value expected for the output signal from the output timer 41, and outputs this ROM output data 2 to the other input of the exclusive NOR circuit 52b. If this input signal is the same level as the input signal from the sampling circuit 50, the output of the exclusive NOR circuit 52b will the HIGH; if the levels are different, the output of the exclusive NOR circuit 52b will the LOW.

Likewise for the other exclusive NOR circuit 52c, the ROM output converter 51 samples the test ROM 44 for the ROM output data 3 that is the value expected for the output signal from the output timer 42, and outputs this ROM output data 3 to the other input of the exclusive NOR circuit 52c. If this input signal is the same level as the input signal from the sampling circuit 50, the output of the exclusive NOR circuit 52c will the HIGH; if the levels are different, the output of the exclusive NOR circuit 52c will the LOW.

When all three inputs to the three-input NAND circuit 52d become HIGH, i.e., when no error is detected in any of the output timers 40–42, the output of the three-input NAND circuit 52d is LOW. When any one of the three inputs to the three-input NAND circuit 52d is LOW, i.e., when an error is detected in any one of the output timers 40–42, the output of the three-input NAND circuit 52d is HIGH, thereby causing the NG interrupt signal generator 53 to output a control signal to the control signal input of the transfer gate 55 such that the transfer gate 55 opens.

When the transfer gate 55 opens, the value of the test address counter determined to be a mismatch (i.e., an error) is transferred to and stored in the NG address memory 56. When the NG address memory 56 is accessed based on the signals input to the three-input AND circuit 58, the transfer gate 57 opens and the counter values stored to the NG address memory 56 are output to the data bus 6.

In addition to the test ROM address counter 54, the reference clock is also input to the sampling circuit 50, ROM output converter 51, and the NG interrupt signal generator 53. The sampling circuit 50 and ROM output converter 51 therefore operate at the same timing based on this reference clock, and the outputs therefrom can therefore be accurately compared by the comparator 52. It is possible that the timing of operation of the sampling circuit 50 and the ROM output converter 51 may vary slightly due to differences in temperature and the power supply voltage, and that a pulse signal may be input to the NG interrupt signal generator 53. To prevent this, the reference clock is also input to the NG interrupt signal generator 53, which is thereby controlled to operate only when the comparator 52 outputs at a valid timing.

Figure 7:
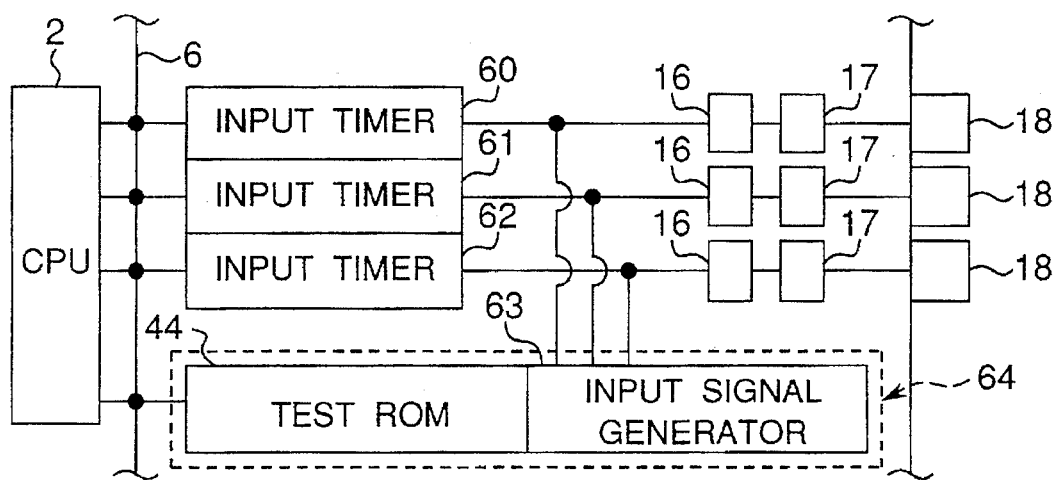
FIG. 7 is a block diagram of a single-chip microprocessor with built-in self-testing function according to an alternative configuration of the first embodiment of the invention.

The test mode operation of a single-chip microprocessor 1 according to the first embodiment above is described below using an input timer as the input module. FIG. 7 is a block diagram of one means of testing the input timers in this single-chip microprocessor 1.

Referring to FIG. 7, the input timers 60, 61, and 62 are connected to the CPU 2 by means of the data bus 6, and are connected to the external input terminals 18 through the corresponding external input interrupting circuit 16 and external input buffer 17. The connections between the input timers 60, 61, and 62 and the external input interrupting circuit 16 are also connected to the input signal generator 63, which functions as the signal generating means for outputting the test input signals to the input timers.

The input signal generator 63 is connected to the test ROM 44 for storing the test pattern data, and said test ROM 44 is further connected through the data bus 6 to the CPU 2. The input timer test circuit 64 is thus formed by the input signal generator 63 and the test When the test mode entry register 8 is set in the test mode, the external input interrupting circuits 16 interrupt the input signals to the input timers 60–62 from the external input terminals 18. The input signal generator 63 generates and outputs the test signals to the input timers 60–62 according to the test pattern data stored to the test ROM 44. The CPU 2 also reads the value counter of the input timers 60–62 to compare the input signal values with the expected values stored to the test ROM, and thereby determines whether each input timer is operating normally.

The operation of the input signal generator 63 shown in FIG. 7 is described below with reference to the schematic diagram thereof shown in FIG. 8.

Figure 8:
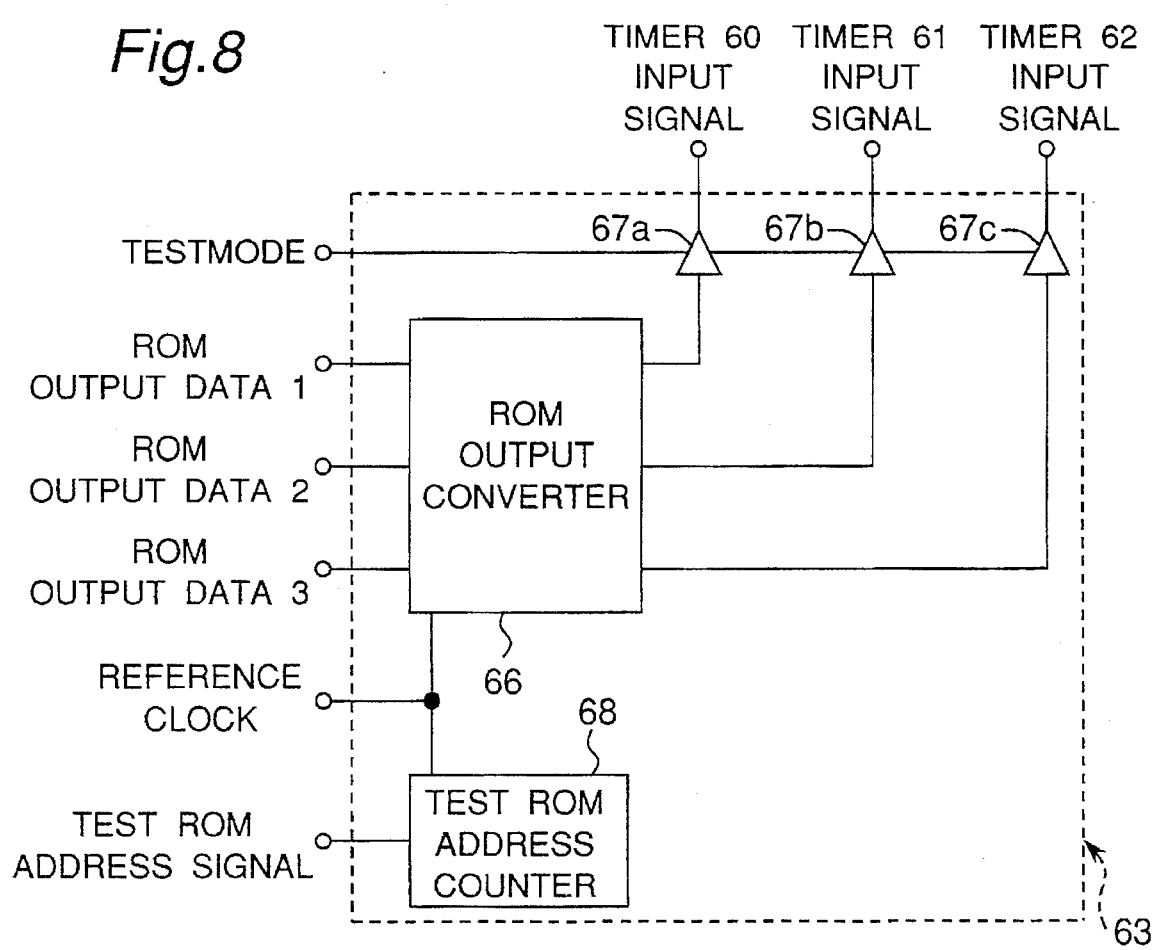
FIG. 8 is a block diagram of the input signal generator shown in FIG. 7.

As shown in FIG. 8, the input signal generator 63 comprises a ROM output converter 66 for sampling and outputting the output data from the test ROM 44; three-state buffers 67a, 67b, and 67c for controlling the input of the signals output from the ROM output converter 66 to the corresponding input timers; and a test ROM address counter 68 for incrementing the test ROM address.

The inputs to the three-state buffers 67a, 67b, and 67c are connected to the ROM output converter 66 in a manner whereby the output data from the test ROM 44 corresponding to input timer 60 is input to three-state buffer 67a; the output data from the test ROM 44 corresponding to input timer 61 is input to three-state buffer 67b; and the output data from the test ROM 44 corresponding to input timer 62 is input to three-state buffer 67c.

The output of the first three-state buffer 67a is connected to input timer 60; the output of the next three-state buffer 67b is connected to input timer 61; and the output of the last three-state buffer 67c is connected to input timer 62; and the control signal inputs of the three-state buffers 67a, 67b, and 67c are connected to the test mode entry register 8. Note that the reference clock is also input to the ROM output converter 66 and the test ROM address counter 68.

Figure 9:
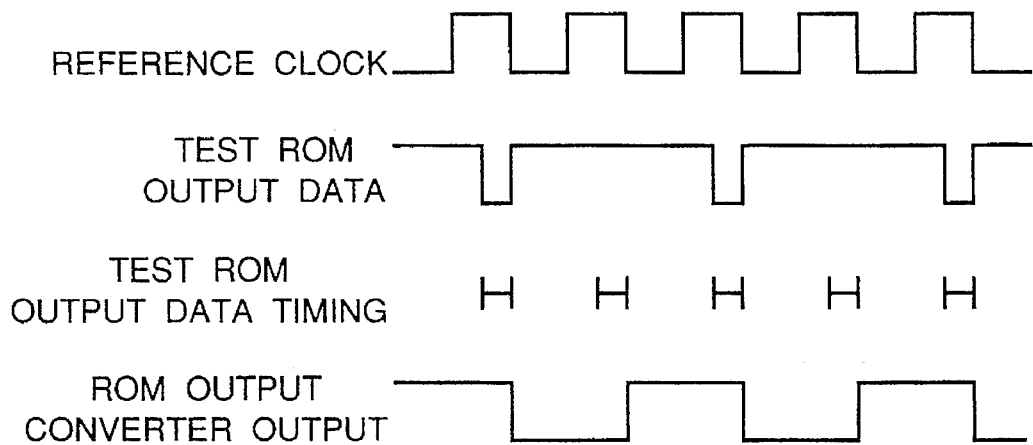
FIG. 9 is a timing chart showing one example of the test ROM output data shown in FIG. 8 and the corresponding output expected from the ROM output converter in this first embodiment of the invention.

FIG. 9 is a timing chart showing one example of the test ROM output data and the corresponding output expected from the ROM output converter 66 by means of the embodiment thus comprised. As shown in this timing chart, the test ROM address counter 68 increments the test ROM address referenced to the reference clock, and the test ROM 44 therefore outputs the ROM output data from this test ROM address to the ROM output converter 66. The ROM output converter 66 samples the ROM output data at the defined timing of the ROM output data, and outputs a signal wave that varies in synchronization to the drop of the reference clock.

When the test mode entry register 8 is set in the test mode, and the control signal inputs to the three-state buffers 67a–67c are HIGH, the three-state buffers 67a–67c become ON and active, and the signals input from the ROM output converter 66 are input to the corresponding input timers 60–62.

An alternative configuration of a single-chip microprocessor 1 according to the first embodiment of the invention described above with reference to FIGS. 1–8 is described below with reference to FIG. 10, a block diagram substituted for FIG. 5 and FIG. 6 of the first embodiment in this alternative configuration. Note that like parts are identified by like reference numbers in FIGS. 1–8 and FIG. 10, and further description thereof is omitted below.

Figure 10:
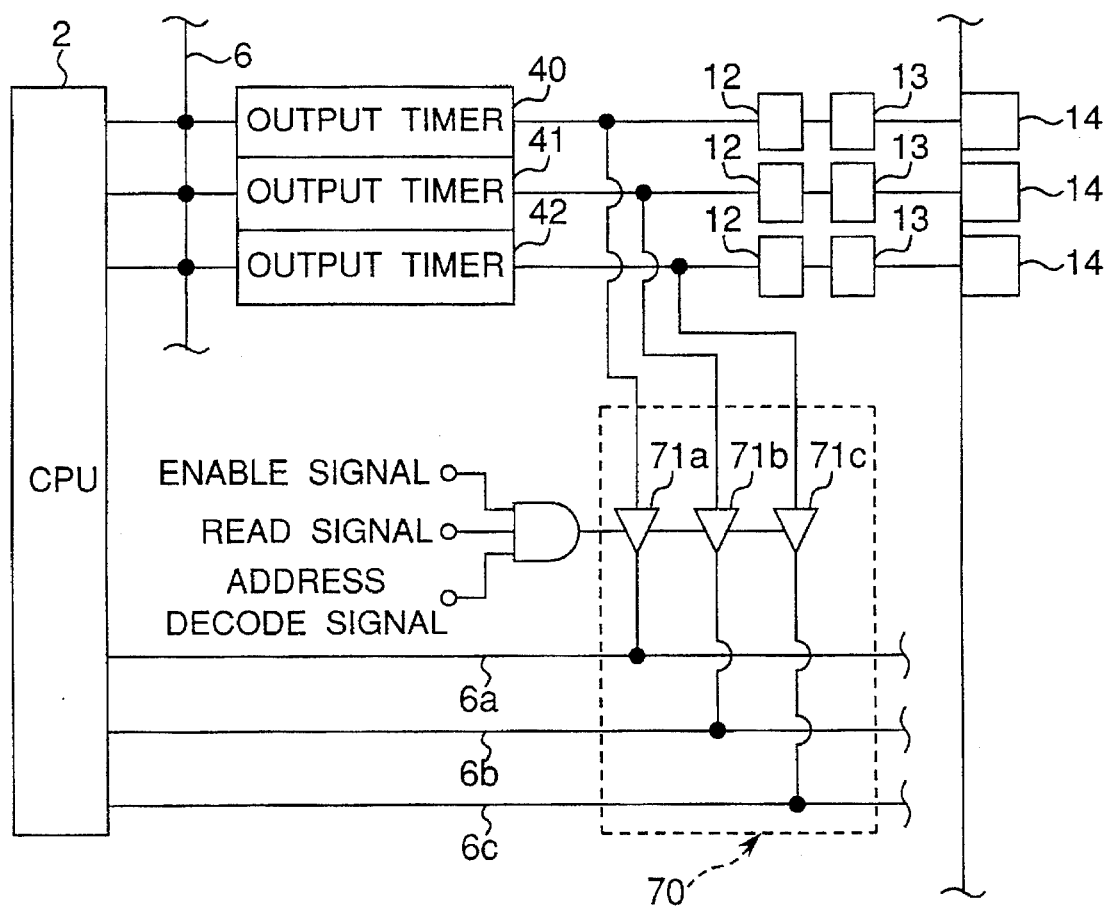
FIG. 10 is a block diagram of one means of testing the output timers in a single-chip microprocessor according to the alternative configuration of the first embodiment of the invention shown in FIG. 7.

Referring to FIG. 10, the output timers 40, 41, and 42 are connected to the CPU 2 by means of the data bus 6, and are connected to the external output terminals 14 through the corresponding external output hold circuits 12 and external output buffers 13. The connections between the output timers 40, 41, and 42 and the external output hold circuits 12 are also connected to the timer data bus output circuit 70 for outputting to the data bus the output of each output timer.

The timer data bus output circuit 70 comprises the same number of three-state buffers as the total number of outputs from the output timers in a manner whereby the output of the first output timer 40 is connected to the input of the first three-state buffer 71a; the output of the next output timer 41 is connected to the input of the next three-state buffer 71b; and the output of the next output timer 42 is connected to the input of the next three-state buffer 71c.

The output of the first three-state buffer 71a is connected to data bus 6a; the output of the next three-state buffer 71b is connected to data bus 6b; and the output of the next three-state buffer 71c is connected to data bus 6c. The control signal inputs of the three-state buffers 71a–71c are connected to the output of the three-input AND circuit 58, the inputs to which are the ENABLE, READ, and address decode signals.

With a test circuit thus comprised, the CPU 2 outputs predetermined test signals to the output timers 40–2 according to the test program stored in the test ROM 3 during the test mode, and sets the ENABLE, READ, and address decode signals HIGH to turn the three-state buffers 71a–71c ON, thereby outputting the output signal from the first output timer 40 to the CPU 2 over the corresponding data bus 6a.

The output signal from the next output timer 41 is likewise output through the corresponding three-state buffer 71b to the data bus 6b, and from there to the CPU 2; and the output signal from the next output timer 42 is output through the corresponding three-state buffer 71c to the data bus 6c, and from there to the CPU 2.

The CPU 2 compares the output data from the output timers 40–42 input to the CPU 2 as described above with the expected values read from the ROM 3 for the output signals from the output timers 40–42 in response to the test signals applied during the test mode to determine whether each output timer is operating normally.

[Embodiment 2]

Figure 11:
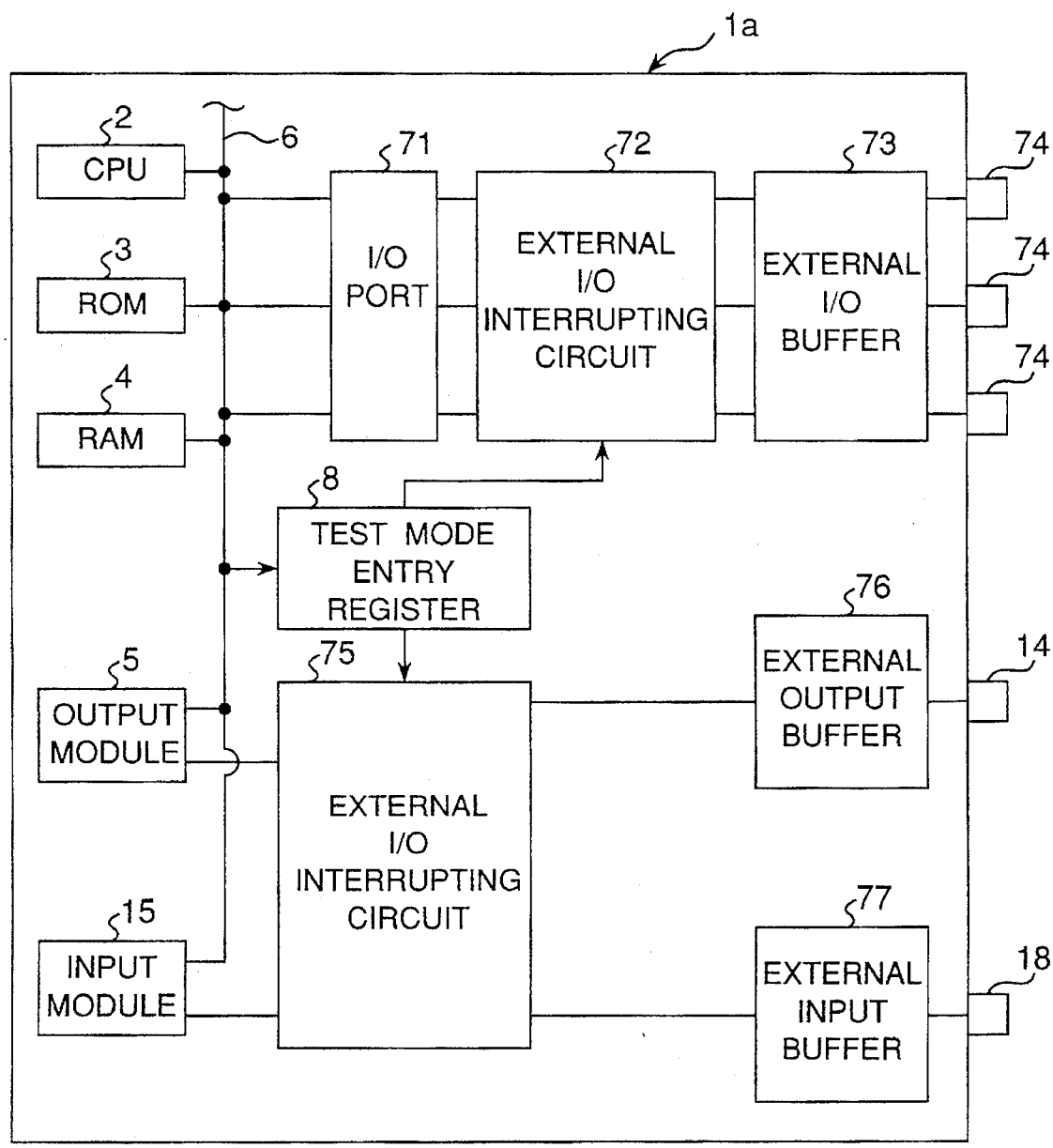
FIG. 11 is a block diagram of a single-chip microprocessor with built-in self-testing function according to the second embodiment of the invention.

FIG. 11 is a block diagram of a single-chip microprocessor with a built-in self-testing function according to the second embodiment of the invention as described below. It is to be noted that like parts in the first embodiment and this second embodiment are identified by like reference numbers, and further description thereof is omitted below; only the differences between the first embodiment shown in FIG. 1 and this second embodiment are described below.

In the single-chip microprocessor 1a in FIG. 11, the output port 7 of the single-chip microprocessor 1 according to the first embodiment shown in FIG. 1 is replaced by an input/output (I/O) port 71; the external output hold circuit 9 shown in FIG. 1 is replaced by an external I/O interrupting circuit 72; the external output buffer 10 is replaced by an external I/O buffer 73; the external output terminals 11 are replaced by external I/O terminals 74; the external output hold circuit 12 and external input interrupting circuit 16 are replaced by an external I/O interrupting circuit 75; the external output buffer 13 is replaced by an external output buffer 76; and the external input interrupting circuit 16 shown in FIG. 1 is replaced by an external input buffer 77. Note, further, that the external I/O interrupting circuits 72 and 75 function as the external terminal interrupting means of the Claims.

In a single-chip microprocessor 1 thus comprised, the CPU 2 resets the test mode entry register 8 during the normal operating mode. As a result, the input/output signal interrupt function of the external I/O interrupting circuits 72 and 75, does not operate; the input/output signals of the I/O port 71 are therefore input/output from the external I/O terminals 74 through the corresponding external I/O interrupting circuit 72 and external I/O buffer 73; the output signal of the output module 5 is output from the external output terminal 14 through the external I/O interrupting circuit 75 and external output buffer 76; and the external input signal from the external input terminal 18 is input to the input module 15 through the external input buffer 77 and external I/O interrupting circuit 75.

When the test mode is selected from the normal operating mode, the test mode entry register 8 is set. As a result, the external I/O interrupting circuits 72 and 75 interrupt signal input/output from the I/O port 71, the output module 5, and the input module 15, and signals are therefore not input or output through the buffers from the external I/O terminals 74, external output terminal 14, or external input terminal 18.

When the self-diagnostic test is completed and the test mode entry register 8 is reset to return from the test mode to the normal operating mode, the interrupt state wherein signal input/output through the buffers from the external I/O interrupting circuits 72 and 75, external I/O terminals 74, external output terminal 14, and external input terminal 18 is disabled is canceled, and the input/output signals of the I/O port 71 are input/output through the external I/O buffer 73 from the external I/O terminals 74. In addition, the output signal from the output module 5 is output directly from the external output terminal 14 through the external output buffer 76, and the external input signals input from the external input terminal 18 through the external input buffer 77 are input to the input module 15.

The flow chart of the test mode operation of the single-chip microprocessor 1a shown in FIG. 11 is identical to that of the first embodiment shown in FIG. 2, and further description thereof is omitted below. The function blocks shown in FIG. 11 are described below with reference to specific schematic diagrams thereof.

Figure 12:
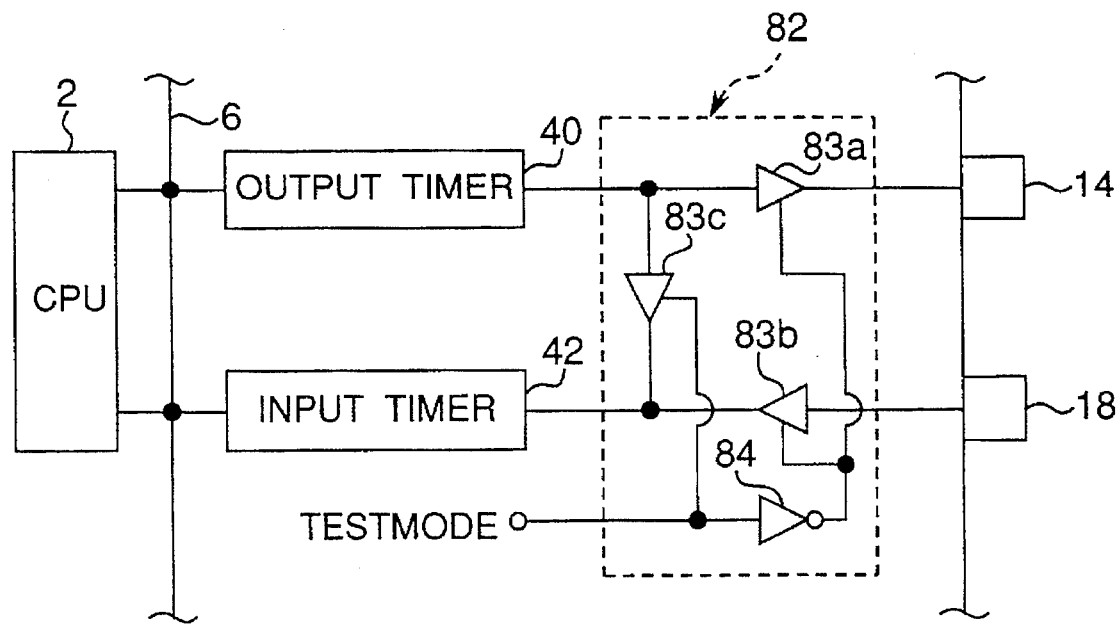
FIG. 12 is a schematic diagram of the external I/O interrupting circuit, external output buffer, and external input buffer shown in FIG. 11.

FIG. 12 is a schematic diagram of the external I/O interrupting circuit 75, external output buffer 76, and external input buffer 77 shown in FIG. 11. As shown in FIG. 12, the output timer 80 and the input timer 81 are connected through the data bus 6 to the CPU 2, and are connected to the timer test circuit 82 providing the functionality of the external I/O interrupting circuit 75, external output buffer 76, and external input buffer 77 shown in FIG. 11. The timer test circuit 82 is also connected to the external output terminal 14 and the external input terminal 18.

The timer test circuit 82 further comprises a TEST MODE terminal to which the TEST MODE signal is input. As described above, the TEST MODE signal indicates whether the normal operating mode or test mode is selected, and sets the test mode entry register 8 for the test mode.

The timer test circuit 82 comprises three three-state buffers 83a, 83b, and 83c, and an invertor 84. The input of the first three-state buffer 83a is connected to the output of the output timer 80, and the output is connected to the external output terminal 14. The input of the next three-state buffer 83b is connected to external input terminal 18, and the output is connected to input timer 81. The input of the next three-state buffer 83c is connected to the connection between the output of the output timer 80 and the input of the first three-state buffer 83a, and the output of this three-state buffer 83c is connected to the connection between the input of the input timer 81 and the output of the other three-state buffer 83b.

The control signal inputs of two three-state buffers 83a and 83b are connected to the output of the invertor 84, the input of which is connected to the TEST MODE terminal. The control signal input of the other three-state buffer 83c is connected to the input of the invertor 84.

When the test mode entry register 8 is reset for the normal operating mode in a single-chip microprocessor 1 thus comprised, a LOW signal is input to the TEST MODE terminal. The control signal input to the one three-state buffer 83c is therefore LOW and said three-state buffer 83c becomes OFF; and the control signal input to the other three-state buffers 83a and 83b is therefore HIGH as a result of the invertor 84, and said three-state buffers become ON. As a result, the output signal of the output timer 80 is Output through the one three-state buffer 83a from the external output terminal 14, and the input signal from the external input terminal 18 is input to the input timer 81 through three-state buffer 83b.

When the test mode entry register 8 is then set for the test mode, a HIGH signal is input to the TEST MODE terminal. The control signal input to the three-state buffer 83c therefore becomes HIGH and said three-state buffer becomes ON; and the control signal input to the other three-state buffers 83a and 83b is LOW as a result of the invertor 84, and said three-state buffers become OFF.

Thus, the output timer 80 and external output terminal 14 are interrupted by the one three-state buffer 83a; and the input timer 81 and external input terminal 18 are interrupted by the next three-state buffer 83b. When the third three-state buffer 83c becomes ON, the output of the output timer 80 is passed to the input of the input timer 81 through the third three-state buffer 83c.

The CPU 2 therefore outputs a test signal to the output timer 80 according to the test program stored in the ROM 3; inputs the output signal from the output timer 80 to the input timer 81; and compares the signal input from the input timer 81 through the data bus 6 with the expected value stored in the ROM 3 to detect errors in the output timer 80, the input timer 81, and all connected circuits related thereto.

The test mode operation of the circuits shown in FIG. 12 is described next below with reference to the flow chart shown in FIG. 13.

Figure 13:
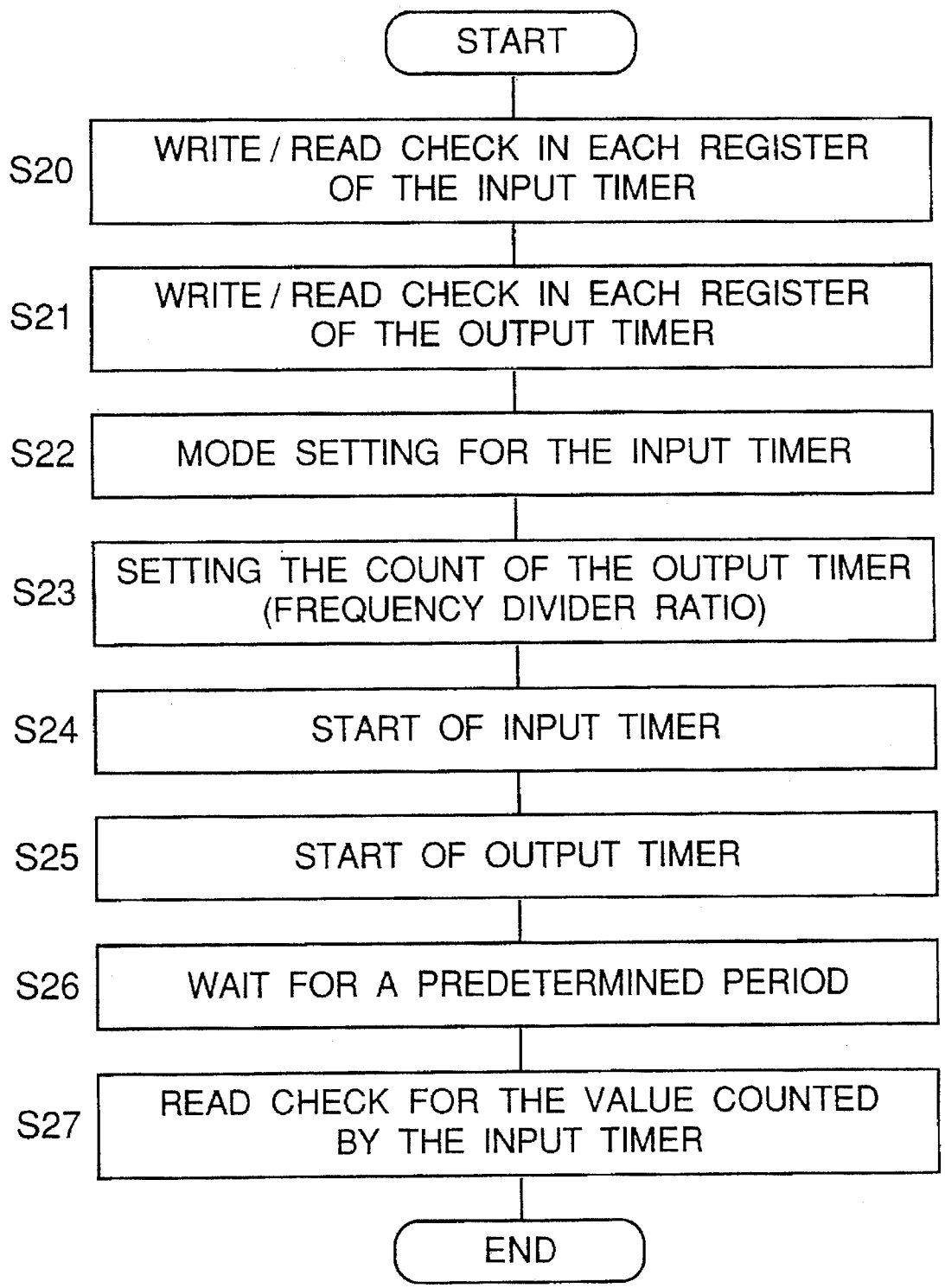
FIG. 13 is a flow chart of the test mode operation of the circuitry shown in FIG. 12.

At the first step S20 in FIG. 13, the CPU 2 executes a write/read check to determine any errors in each register of the input timer 81, and similarly executes a write/read check to determine any errors in each register of the output timer 80 in step S21.

In step S22, the CPU 2 accomplishes the various mode settings, including selecting whether to increment the timer count at the input signal rise edge, drop edge, or both edges, and setting the frequency divider ratio. In step S23, the count of the output timer 80, i.e., the frequency dividing ratio, is set; the input timer 81 is started in step S24; the output timer 80 is started in step S25; a wait is executed (the output timer 80 is driven) for a predetermined period in step S26; the value counted by the input timer 81 is read to check for any errors in step S27; and the sequence then terminates.

Figure 14:
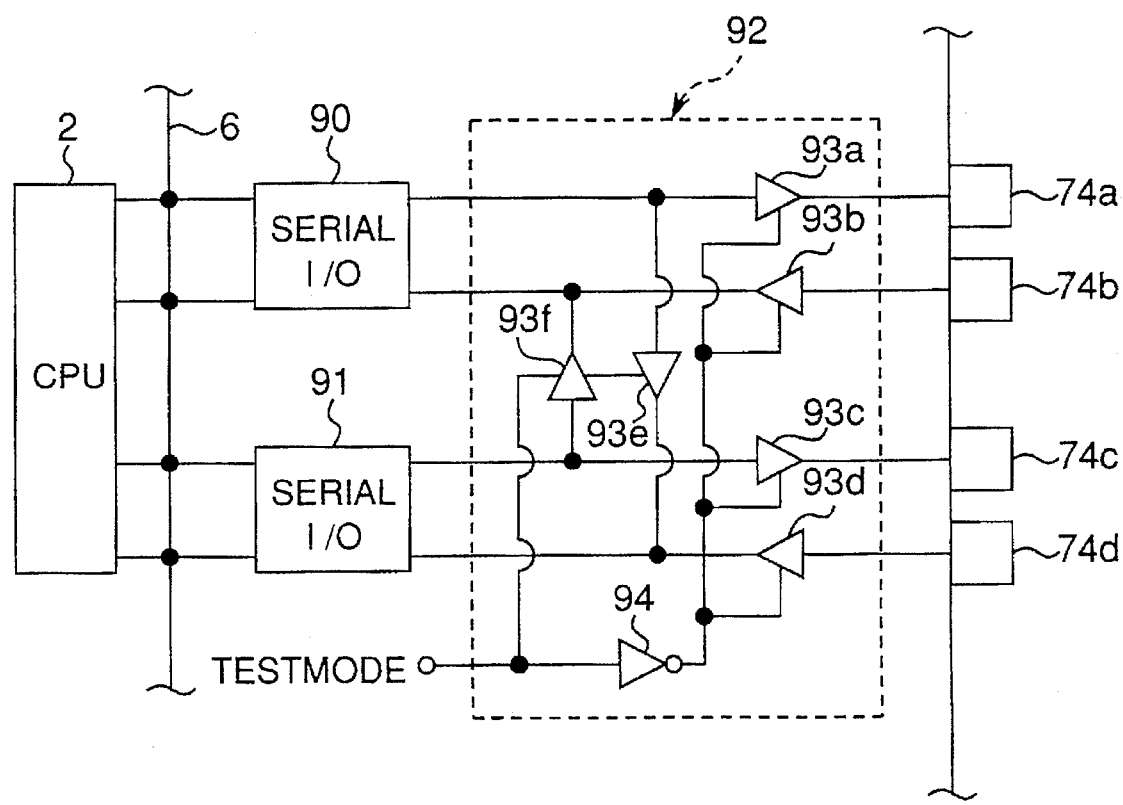
FIG. 14 is a schematic diagram of the I/O port 71, external I/O interrupting circuit 72, and external I/O buffer 73 shown in FIG. 11.

FIG. 14 is a schematic diagram of the I/O port 71, external I/O interrupting circuit 72, and external I/O buffer 73 shown in FIG. 11.

Referring to FIG. 14, the internal input and internal output of the serial I/O 90 and serial I/O 91 corresponding to the I/O port 71 shown in FIG. 11 for input from and output to the CPU 2 are connected to the CPU 2 through the data bus 6.

The external output of the serial I/O 90 for outputting to the external output terminal is connected to a serial I/O test circuit 92 combining the functionality of the external I/O interrupting circuit 72 and external I/O buffer 73 shown in FIG. 11. The serial I/O test circuit 92 is also connected to external output terminals 74a and 74c, and to external input terminals 74b and 74d. The serial I/O test circuit 92 further comprises a TEST MODE terminal to which the TEST MODE signal is input. As described above, the TEST MODE signal indicates whether the normal operating mode or test mode is selected, and sets the test mode entry register 8 for the test mode.

The serial I/O test circuit 92 comprises six three-state buffers 93a–93f, and an invertor 94. The input of three-state buffer 93a is connected to the external output terminal of the serial I/O 90, and the output of said three-state buffer is connected to the external output terminal 74a. The input of three-state buffer 93b is connected to the external input terminal 74b, and the output of said three-state buffer is connected to the external input terminal of the serial I/O 90.

The input of three-state buffer 93c is likewise connected to the external output terminal of the serial I/O 91, and the output of said three-state buffer is connected to the external output terminal 74c. The input of three-state buffer 93d is connected to the external input terminal 74d, and the output of said three-state buffer is connected to the external input terminal of the serial I/O 91.

The input to three-state buffer 93e is connected to the connection between the external output terminal of the serial I/O 90 and the input of the three-state buffer 93a, and the output of said three-state buffer is connected to the connection between the external input terminal of the serial I/O 91 and the output of the three-state buffer 93d.

The output of the three-state buffer 93f is connected to the connection between the external input terminal of the serial I/O 90 and the output of the three-state buffer 93b, and the input of said three-state buffer is connected to the connection between the external output terminal of the serial I/O 91 and the input of the three-state buffer 93c.

The control signal inputs to three-state buffers 93a–93d are connected to the output of the invertor 94, the input of which is connected to the TEST MODE terminal. The control signal inputs of the three-state buffers 93e and 93f are connected to the input to the invertor 94.

In a single-chip microprocessor 1a thus comprised, when the test mode entry register 8 is reset in the normal operating mode, a LOW signal is input to the TEST MODE terminal. A LOW control signal is thus input to the three-state buffers 93e and 93f, which become OFF. The control signal input to the three-state buffers 93a–93d is thus inverted to HIGH by the invertor 94, and these three-state buffers 93a–93d become ON.

As a result, the external output signal of the serial I/O 90 is output through three-state buffer 93a from external output terminal 74a and the external input signal from external input terminal 74b is input through the three-state buffer 93b to the external input terminal of the serial I/O 90. The external output signal of the other serial I/O 91 is output through the three-state buffer 93c from external output terminal 74c and the external input signal from the external input terminal 74d is passed through the three-state buffer 93d to the external input terminal of the serial I/O 91.

When the test mode entry register 8 is set in the test mode, a HIGH signal is input to the TEST MODE terminal. The control signal input to the three-state buffers 93e and 93f therefore becomes HIGH and said three-state buffers become ON; and the control signal input to the three-state buffers 93a–93d is thus inverted to LOW by the invertor 94, and these three-state buffers 93a–93d become OFF.

As a result, the connection between the external output of the serial I/O 90 and the external output terminal 74a is interrupted by three-state buffer 93a, and the connection between the external input terminal of the serial I/O 90 and external input terminal 74b is interrupted by three-state buffer 93b. Similarly, the connection between the external output of the serial I/O 91 and the external output terminal 74c is interrupted by three-state buffer 93c, and the connection between the external input terminal of the serial I/O 91 and external input terminal 74d is interrupted by three-state buffer 93d.

When three-state buffers 93e and 93f become ON, the external output terminal of the serial I/O 90 is connected through the three-state buffer 93e to the external input terminal of the other serial I/O 91, and the external output terminal of this serial I/O 91 is connected through the three-state buffer 93f to the external input terminal of the first serial I/O 90.

When the CPU 2 outputs a test signal to the internal inputs of serial I/O 90 and serial I/O 91 according to the test program stored in the ROM 3, the output signal from the first serial I/O 90 is input to the other serial I/O 91, and the CPU 2 compares the signal input through the data bus 6 from the second serial I/O 91 with the expected value read from the ROM 3. The output signal from the second serial I/O 91 is also input to the first serial I/O 90, and the CPU 2 compares the signal input through the data bus 6 from the serial I/O 90 with the expected value read from the ROM 3. The CPU 2 thus detects any errors in the serial I/O units 90 and 91 and the circuits connected thereto as a result of this comparison operation.

Figure 15:
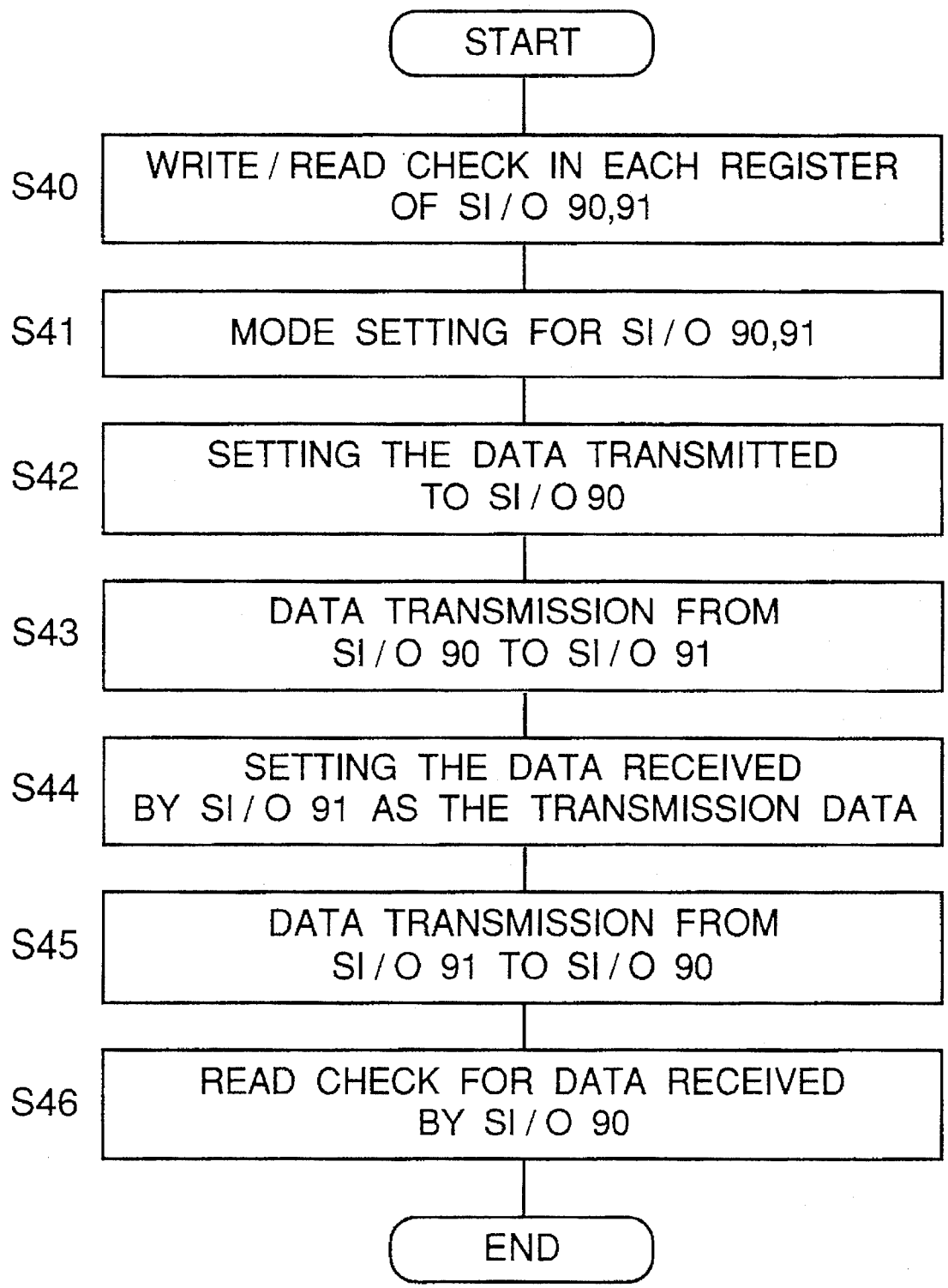
FIG. 15 is a flow chart of the test mode operation of the circuitry shown in FIG. 14.

The test mode operation of the apparatus shown in FIG. 14 is described below with reference to the flow chart in FIG. 15.

At the first step S40, the CPU 2 executes a write/read check to determine any errors in each register of the serial I/O units 90 and 91. In step S41, the CPU 2 accomplishes the various mode settings, including the baud rate of the serial I/O units 90 and 91. In step S42, the data transmitted to the one serial I/O 90 is set, and in step S43 the transmission data is sent from the external output terminal of the serial I/O 90 to the external input terminal of the other serial I/O 91.

In step S44, the CPU 2 sets the data received by the second serial I/O 91 from the first serial I/O 90 as the transmission data; then transmits this transmission data from the external output terminal of the second serial I/O 91 to the external input terminal of the first serial I/O 90 in step S45. The data received by the first serial I/O 90 is then read and checked for errors in step S46 before terminating the procedure.

[Embodiment 3]

Figure 16:
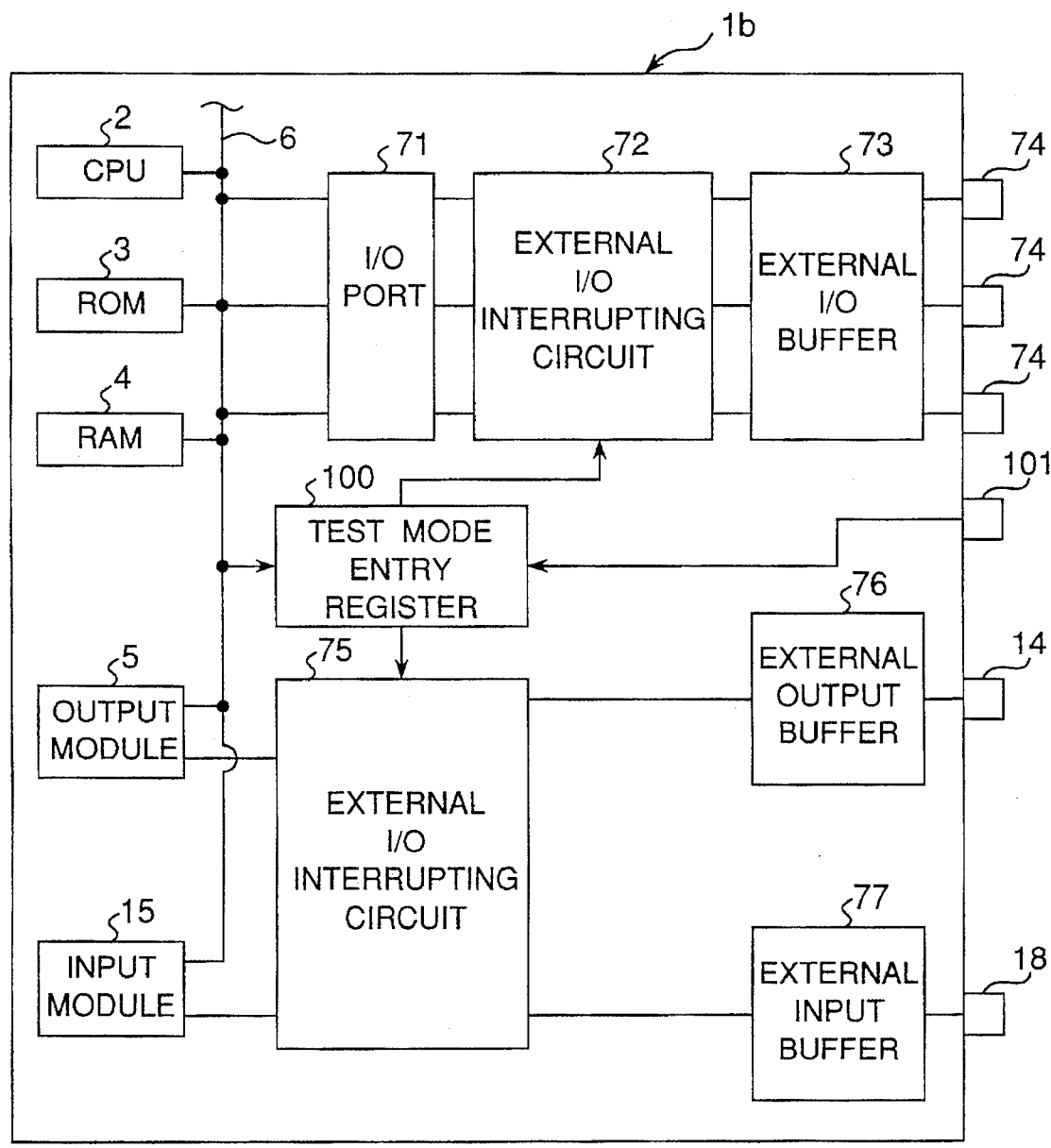
FIG. 16 is a block diagram of a single-chip microprocessor with built-in self-testing function according to the third embodiment of the invention.

FIG. 16 is a block diagram of a single-chip microprocessor with a built-in self-testing function according to the third embodiment of the invention as described below. It is to be noted that like parts in this embodiment and the first and second embodiments above are identified by like reference numbers, and further description thereof is omitted below; only the differences between the second embodiment Shown in FIG. 11 and this third embodiment are described below.

As shown in FIG. 16, the single-chip microprocessor 1b of this third embodiment replaces the test mode entry register 8 of the second embodiment shown in FIG. 11 with a test mode entry register 100, and further comprises an external input terminal 101 connected to the test mode entry register 100 for inputting a setting signal from an external source for setting the test mode entry register 100.

The test mode entry register 100 is thus set and reset by the signal input thereto from the external input terminal 101. As a result, the test mode and normal operating mode are selected based on this signal input from this external input terminal 101.

A flow chart describing the test mode operation of the single-chip microprocessor 1b shown in FIG. 16 is identical to that of the first embodiment shown in FIG. 2 except for the substitution of the test mode entry register 100 of the third embodiment for the test mode entry register 8 of the first and second embodiments, and further description thereof is omitted below.

Figure 17:
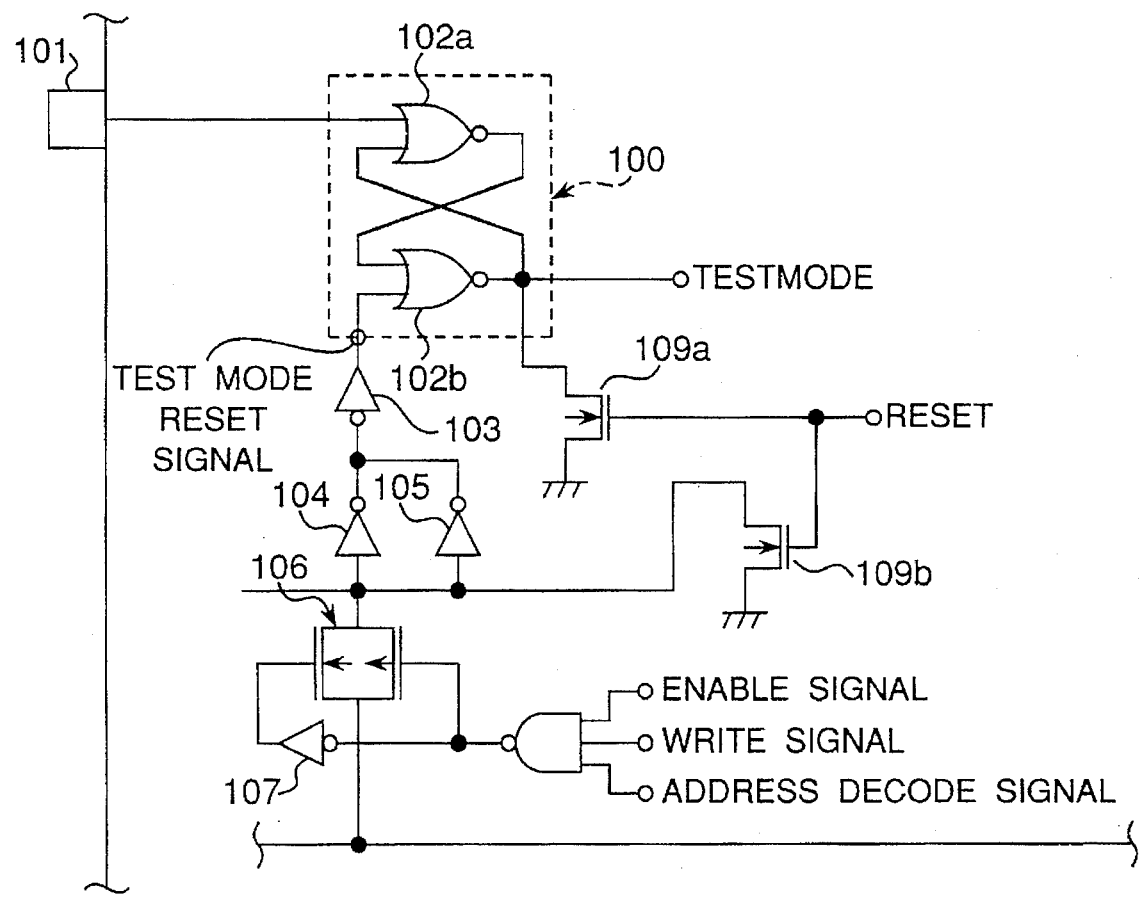
FIG. 17 is a schematic diagram of the test mode entry register 100 shown in FIG. 16.

FIG. 17 is a schematic diagram of the test mode entry register 100 shown in FIG. 16.

Referring to FIG. 17, an RS flip-flop functioning as the test mode entry register 100 is formed by means of NOR circuits 102a and 102b. One input terminal of the first NOR circuit 102a is connected to the external input terminal 101.

Invertors 104 and 105 are serially connected in a loop to form a latch circuit with one input of the second NOR circuit 102b connected through invertor 103 to the connection between the output of invertor 104 and the input of invertor 105. The output of this NOR circuit 102b is connected to the TEST MODE terminal from which the TEST MODE signal is output. As described above, the test mode signal indicates whether the operating mode is the normal operating mode or the test mode; the test mode entry register 100 is set (the test mode signal is set) during the test mode.

The output of a transfer gate 106 is connected between the input to the invertor 104 and the output of the invertor 105, and the input of this transfer gate 106 is connected to the data bus 6. The input of an invertor 107 is connected to the one control signal input 106a of the transfer gate 106; the output of another invertor 107 is connected to the other control signal input 106b; the connection between the control signal input 106a and invertor 107 is connected to the output of a three-input NAND circuit 108; and the three inputs to the three-input NAND circuit 108 are the ENABLE, WRITE, and DECODE signals.

The drain of an n-channel MOS-FET 109a is connected to the output of the NOR circuit 102b; the source is grounded;

and the gate is connected to the gate of a second n-channel MOS-FET 109b. The drain of this second n-channel MOS-FET 109b is connected to the connection between the input to invertor 104 and the output of invertor 105; and the source is grounded. Note that a reset signal resetting the test mode entry register 100 is input to the gates of the n-channel MOS-FETs 109a and 109b during initialization and when resuming the normal operating mode.

Figure 18:
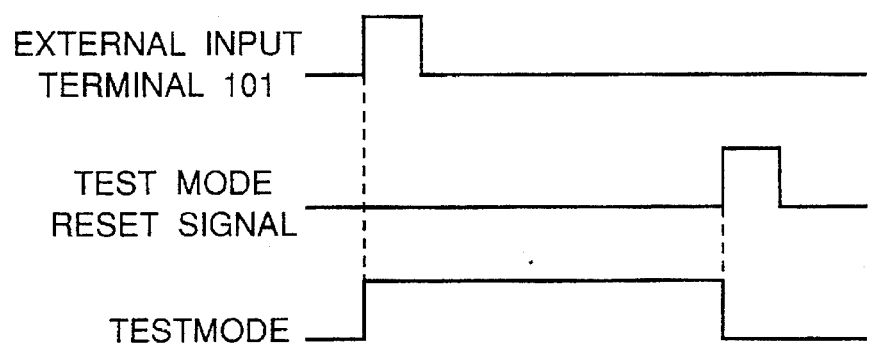
FIG. 18 is a timing chart of the signals flowing through the circuitry shown in FIG. 17.
Figure 19:
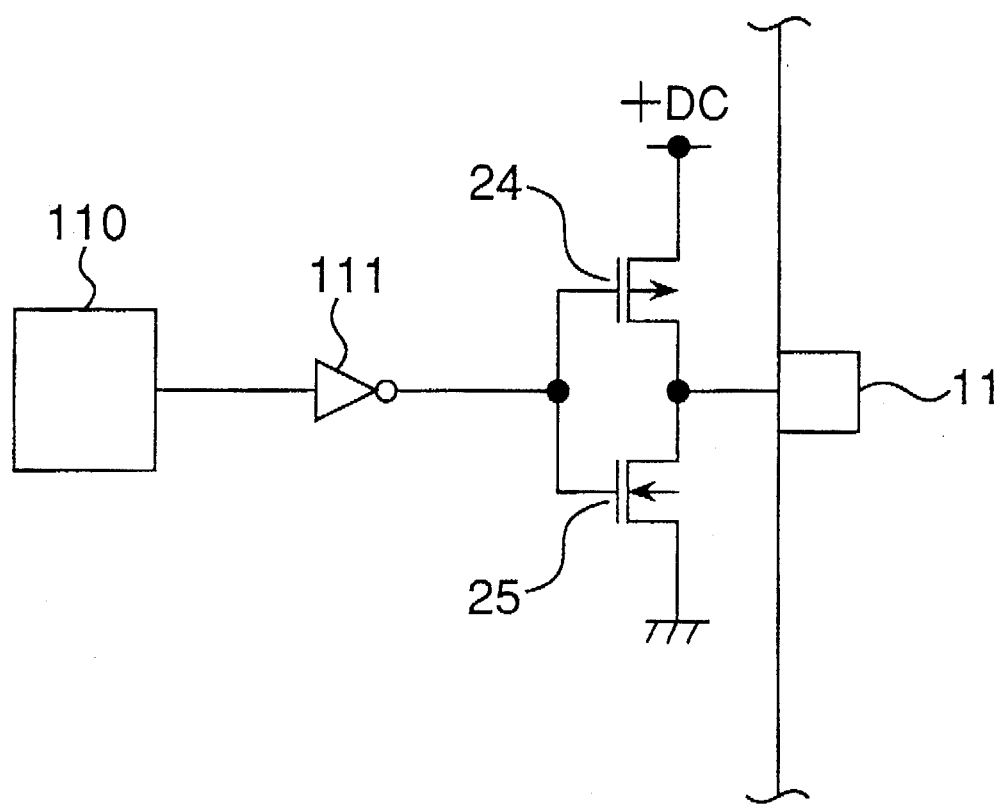
FIG. 19 is a block diagram of the external output circuit of a conventional single-chip microprocessor.

As shown in the timing chart in FIG. 18, a HIGH one-shot pulse signal is input from the external input terminal 101 to the one input of the NOR circuit 102a when in the test mode. A LOW signal is also input through invertor 103 by means of the latch circuit comprising invertors 104 and 105 to the one input of NOR circuit 102b to set the test mode entry register 100. A HIGH test mode signal is therefore output from the TEST MODE terminal, and the operating mode is switched from the normal operating mode to the test mode.

When the test mode terminates, the ENABLE, WRITE, and DECODE signals are HIGH; the output from the three-input NAND circuit 108 is LOW; the one control signal input 106a of the transfer gate 106 is LOW; the other control signal input 106b is set HIGH by the invertor 107; and the transfer gate 106 opens to input the test mode cancellation signal, which is the HIGH one-shot pulse signal from the data bus 6, through the two invertors 104 and 103 to the other input of the second NOR circuit 102b. The external input terminal 101 at this time is LOW, the test mode entry register 100 is reset, and a LOW signal is output from the TEST MODE terminal.

To reset the test mode entry register 100, a reset signal can be input to the RESET terminal connected between the gates of the n-channel MOS-FETs 109a and 109b. When a HIGH reset signal is input to the gates of the n-channel MOS-FETs 109a and 109b, the n-channel MOS-FETs 109a and 109b become ON; the TEST MODE terminal is grounded LOW through the one n-channel MOS-FET 109a; the test mode entry register 100 is reset; and the other n-channel MOS-FET 109b initializes the latch circuit of invertors 104 and 105, i.e., causes a LOW to be output from the invertor 103.

It is to be noted that in each of the three preferred embodiments described above the test mode program is described as being stored in the ROM, but it will be obvious that the test mode program can be stored in another type of memory, including RAM. In addition, the test mode entry register is described as being set during the test mode, but it will also be obvious that the test mode entry register may be reset for the test mode, in which case the test mode entry register is set during the normal operating mode.

[Effects of the invention]

As will be obvious from the above descriptions of the invention, the level of the signal output to the external output terminal from the function module to be tested is held during the test mode, which is the operating mode in which the self-diagnostic test is executed, at the level when the test mode was selected. As a result, the module being tested can be controlled to output in response to a specific test signal without using a tester and with the single-chip microprocessor 1 mounted to a circuit board and connected to the external electronic devices mounted thereon without outputting extraneous signals to these externally connected devices.

Furthermore, because signals output from the target test module to the external output terminal, and/or signals input from an external input terminal to the target test module, are cut off from the target test module during the test mode, a self-diagnostic test can be executed by inputting and outputting test signals to and from the target test module without using a tester and with the single-chip microprocessor 1 mounted to a circuit board and connected to the external electronic devices mounted thereon without outputting extraneous signals from the external output terminal even when the external output terminal can be opened without adversely affecting device operation.

In addition, a self-diagnostic test can be executed by inputting and outputting test signals to and from the target test module without using a tester and with the single-chip microprocessor 1 mounted to a circuit board and connected to the external electronic devices mounted thereon without outputting extraneous signals from the external output terminal because the level of the signal output to the external output terminal from the function module to be tested is held during the test mode at the level when the test mode was selected, and because the signals input from an external input terminal to the target test module are cut off from the target test module during the test mode.

In addition, the test mode signal, which is the control signal used during the test mode, can be generated by setting the test mode entry register.

Furthermore, by selecting the test mode during the idle time of the single-chip microprocessor, a self-diagnostic test can be executed for any target test module without using a tester and with the single-chip microprocessor 1 mounted to a circuit board and connected to the external electronic devices mounted thereon without adversely affecting said external devices.

It is also possible to generate the input signal for self-diagnostic testing of the input module targeted by the self-diagnostic test because a test ROM is provided and the test input signals are generated according to the content of the test ROM. It is also possible to execute the self-diagnostic test by reading the counter and/or other values of the input module, e.g., an input timer, being tested.

The pulse count and output timing of the output timer or other output module can also be tested, and the address of any error can be stored to facilitate debugging, because a test. ROM is provided, the test signals can be output from the output module being tested according to the content of the test ROM, and errors can be detected by comparing said output signals with the expected values stored to the test ROM.

During the test mode the CPU can also access and read from the data bus the output signal from the output module being tested, and can execute a self-diagnostic test of the output signal from the output timer or other output module without using a tester.

Also during the test mode, output timer and input timer operation can be tested simultaneously, and plural serial input/output units can input and output to each other to check the operation thereof, without using a tester because the signals output from the output module to the external output terminal, and/or the signals input to the input module from the external input terminal, are cut off from the module being tested, and the output and input modules are connected in a manner whereby the output signal from the output module is input to the input module.

It is also possible to externally select the test mode, and to internally cancel the test mode within the single-chip microprocessor when the test is completed, because the test mode signal can be input from an external source to switch from the normal operating mode to the test mode.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A single-chip microprocessor with a built-in self-testing function for testing the internal circuitry thereof comprising:

a test mode signal output means for outputting the test mode signal when in the test mode which is a mode for self-diagnostic testing of the internal circuitry;

an external terminal interrupting means for interrupting the input and output of signals from the external terminal based on the test mode signal from the test mode signal output means, the internal circuitry of the single-chip microprocessor being tested when signal input/output from the external terminal is interrupted; and a connecting means for interconnecting the input terminals and output terminals of different internal circuits forming plural function modules based on the test mode signal from the test mode signal output means, the input terminals of the internal circuits forming the function modules for which input/output of signals is interrupted at the external terminals being connected with the output terminals of the internal circuits forming the other function modules for testing each of said internal circuits.

2. A single-chip microprocessor with a built-in self-testing function according to claim 1 wherein the connecting means is characterized by:

connecting the output of an internal output timer with the input of an internal input timer based on the test mode signal from the test node signal means; and testing for normal operation by detecting the signals input and output between said timers.

3. A single-chip microprocessor with a built-in self-testing function according to claim 1 wherein the connecting means is characterized by:

connecting the output of a serial input/output with the input of another serial input/output; and testing for normal operation by detecting the signals input and output between said serial input/output.

4. A single-chip microprocessor with a built-in self-testing function for testing the internal circuitry thereof comprising:

a test mode signal output means for outputting the test mode signal when in the test mode, which is a mode for self-diagnostic testing of the internal circuitry; and an external output holding means disposed to an external output means for outputting signals from an external output terminal, and holding the output signal status of the external output terminal while the test mode signal is input from the test mode signal output means, the internal circuitry of the single-chip microprocessor being tested while holding the output signal status of the external output terminal, wherein the test mode signal output means comprises a register, said register is set to a first state and the test mode signal is output based on a start signal received at the start of the test mode, and said register is set to a second state and the test mode signal is canceled based on a cancellation signal received when the test mode ends.

5. A single-chip microprocessor with a built-in self-testing function according to claim 4 wherein:

the test mode signal output means is characterized by the test mode start and end signals input thereto being input from the central processing unit.

6. A single-chip microprocessor with a built-in self-testing function according to claim 4 wherein:

the test mode signal output means is characterized by the test mode start and end signals input thereto being input from an external terminal.

7. A single-chip microprocessor with a built-in self-testing function for testing the internal circuitry thereof comprising:

a test mode signal output means for outputting the test mode signal when in the test mode, which is a mode for self-diagnostic testing of the internal circuitry;

an external output holding means disposed to an external output means for outputting signals from an external output terminal, and holding the output signal status of the external output terminal while the test mode signal is input from the test mode signal output means, the internal circuitry of the single-chip microprocessor being tested while holding the output signal status of the external output terminal;

a storage means for storing the test mode program; and a signal generating means for generating signals according to the program stored by the storage means, wherein the signal generating means generates a testing input signal to the internal circuit forming the input module to be tested.

8. A single-chip microprocessor with a built-in self-testing function for testing the internal circuitry thereof comprising:

a test mode signal output means for outputting the test mode signal when in the test mode, which is a mode for self-diagnostic testing of the internal circuitry;

an external output holding means disposed to an external output means for outputting signals from an external output terminal, and holding the output signal status of the external output terminal while the test mode signal is input from the test mode signal output means, the internal circuitry of the single-chip microprocessor being tested while holding the output signal status of the external output terminal;

a storage means for storing the test mode program; and a testing means for testing the internal circuit targeted by the test according to the program stored by the storage means, wherein the testing means determines whether the output module being tested is normal or defective by comparing the output signal from the internal circuit forming said output module with an expected value stored in the storage means.

* * * * *